(12) United States Patent
Purves et al.

(10) Patent No.: US 7,718,893 B2
(45) Date of Patent: May 18, 2010

(54) ADJUSTABLE PLASTER RING COVER

(75) Inventors: Steve Purves, Costa Mesa, CA (US); Dennis L. Grudt, Long Beach, CA (US); John Karns, Victorville, CA (US)

(73) Assignee: ProtectConnect, Solana Beach, CA (US)

( * ) Notice: Subject to any disclaimer, the term of this patent is extended or adjusted under 35 U.S.C. 154(b) by 0 days.

(21) Appl. No.: 12/176,828

(22) Filed: Jul. 21, 2008

(65) Prior Publication Data

US 2009/0020306 A1    Jan. 22, 2009

Related U.S. Application Data

(63) Continuation of application No. 11/829,796, filed on Jul. 27, 2007.

(60) Provisional application No. 60/833,966, filed on Jul. 29, 2006.

(51) Int. Cl.
*H01H 9/02* (2006.01)
*H02G 3/14* (2006.01)

(52) U.S. Cl. .................. 174/53; 174/57; 174/58; 174/66; 220/3.2; 220/3.7; 220/4.02

(58) Field of Classification Search ............ 174/480, 174/481, 50, 53, 57, 58, 503, 66, 67; 220/3.2–3.9, 220/4.02, 241, 242; 248/906
See application file for complete search history.

(56) References Cited

U.S. PATENT DOCUMENTS

| | | | |
|---|---|---|---|
| 723,866 A | 3/1903 | Hart | |
| 776,855 A | 12/1904 | La Har | |
| 949,123 A | 2/1910 | Klein | |
| 1,171,914 A | 2/1916 | Wright | |
| 1,328,224 A | 1/1920 | Benjamin | |
| 2,163,201 A | 6/1939 | Kalencik | |
| 2,189,251 A | 2/1940 | Potter | |
| 2,433,917 A | 1/1948 | McCartney | |
| 2,447,597 A | 8/1948 | Reed | |
| 2,477,803 A | 8/1949 | Huber | |
| 2,524,701 A | 10/1950 | Grill | |
| 2,908,743 A | 10/1959 | Premoshis | |
| 2,969,518 A | 1/1961 | Slater | |

(Continued)

FOREIGN PATENT DOCUMENTS

CN    2381040 Y    5/2000

OTHER PUBLICATIONS

Cooper Industries, Inc.; Crouse-Hinds Division, Power-Lock Locking Device—Product Specification, 1996, pp. B6. B55, Syracuse, NY.

*Primary Examiner*—Angel R Estrada
(74) *Attorney, Agent, or Firm*—Knobbe, Martens, Olson & Bear, LLP

(57) ABSTRACT

A power distribution system has an electrical box configured to attach a power cable, a plaster ring releasably mounted to the box and one or more electrical devices installed into the ring. A pre-wired ground extends from a first end physically and electrically connected to a ground terminal on the electrical device. The plaster ring is movable between a closed position proximate the box and an open position distal the box. The pre-wired ground is configured as a lanyard so as to support the plaster ring as a wiring platform in the open position for connecting wires between the power cable and the electrical device or devices.

16 Claims, 21 Drawing Sheets

U.S. PATENT DOCUMENTS

| | | |
|---|---|---|
| 3,189,077 A | 6/1965 | Willis, Jr. et al. |
| 3,214,726 A | 10/1965 | Cardenas et al. |
| 3,317,881 A | 5/1967 | Setecka |
| 3,467,941 A | 9/1969 | Martin |
| 3,489,985 A | 1/1970 | Martin |
| 3,510,822 A | 5/1970 | Patterson |
| 3,588,786 A | 6/1971 | Alfiero |
| 3,609,647 A | 9/1971 | Castellano |
| 3,654,663 A | 4/1972 | Algotsson |
| 3,710,287 A | 1/1973 | Eckert |
| 3,732,524 A | 5/1973 | Reed et al. |
| 3,868,161 A | 2/1975 | Frantz |
| 3,879,101 A | 4/1975 | McKissic |
| 3,930,704 A | 1/1976 | Dekanic |
| 3,972,498 A | 8/1976 | Paskert |
| 4,103,125 A | 7/1978 | Marrero |
| 4,105,884 A | 8/1978 | Damsky |
| 4,117,258 A | 9/1978 | Shanker |
| 4,148,536 A | 4/1979 | Petropoulsos et al. |
| 4,165,443 A | 8/1979 | Figart et al. |
| 4,166,934 A | 9/1979 | Marrero |
| 4,179,175 A | 12/1979 | Farnworth et al. |
| 4,196,521 A | 4/1980 | Hutchinson et al. |
| 4,230,386 A | 10/1980 | Farnworth et al. |
| 4,263,472 A | 4/1981 | Maheu |
| 4,343,411 A | 8/1982 | Chesnut et al. |
| 4,372,634 A | 2/1983 | Ritchie et al. |
| 4,403,824 A | 9/1983 | Scott |
| 4,427,864 A | 1/1984 | Oster |
| 4,445,739 A | 5/1984 | Wooten |
| 4,485,282 A | 11/1984 | Lee |
| 4,493,517 A | 1/1985 | Hillary |
| 4,599,485 A | 7/1986 | Smolik |
| 4,600,258 A | 7/1986 | Hu |
| 4,605,270 A | 8/1986 | Aslizadeh |
| 4,607,906 A | 8/1986 | Munroe |
| 4,612,412 A | 9/1986 | Johnston |
| 4,617,613 A | 10/1986 | Rice |
| 4,626,052 A | 12/1986 | Rumble |
| 4,627,675 A | 12/1986 | Taylor et al. |
| 4,634,015 A | 1/1987 | Taylor |
| 4,640,564 A | 2/1987 | Hill |
| 4,645,089 A | 2/1987 | Horsley |
| 4,664,457 A | 5/1987 | Suchy |
| 4,722,693 A | 2/1988 | Rose |
| 4,747,506 A | 5/1988 | Stuchlik, III |
| 4,750,890 A | 6/1988 | Dube et al. |
| 4,780,088 A | 10/1988 | Means |
| 4,784,614 A | 11/1988 | Sadigh-Behzadi |
| 4,798,916 A | 1/1989 | Engel et al. |
| 4,808,127 A | 2/1989 | Swanic |
| 4,842,551 A | 6/1989 | Heimann |
| 4,871,893 A | 10/1989 | Slovak et al. |
| 4,873,469 A | 10/1989 | Young et al. |
| 4,880,950 A | 11/1989 | Carson et al. |
| 4,914,265 A | 4/1990 | Mongeau |
| D308,045 S | 5/1990 | Counts et al. |
| 4,952,164 A | 8/1990 | Weber et al. |
| D310,814 S | 9/1990 | Rosenbaum |
| 4,967,990 A | 11/1990 | Rinderer |
| 4,972,045 A | 11/1990 | Primeau |
| 4,988,840 A | 1/1991 | Carson et al. |
| D316,250 S | 4/1991 | Mongeau |
| 5,012,043 A | 4/1991 | Seymour |
| 5,030,119 A | 7/1991 | Lowe |
| 5,042,673 A | 8/1991 | McShane |
| 5,092,787 A | 3/1992 | Wise et al. |
| 5,098,046 A | 3/1992 | Webb |
| 5,178,555 A | 1/1993 | Kilpatrick et al. |
| 5,209,444 A | 5/1993 | Rinderer |
| 5,245,507 A | 9/1993 | Ericksen |
| D341,125 S | 11/1993 | Miller |
| 5,288,041 A | 2/1994 | Webb |
| 5,289,934 A | 3/1994 | Smith et al. |
| 5,293,097 A | 3/1994 | Elwell |
| 5,297,973 A | 3/1994 | Gorman |
| 5,330,137 A | 7/1994 | Olivia |
| 5,342,993 A | 8/1994 | Siems |
| 5,386,959 A | 2/1995 | Laughlin et al. |
| 5,397,929 A | 3/1995 | Hogarth et al. |
| 5,399,806 A | 3/1995 | Olson |
| 5,415,564 A | 5/1995 | Winter et al. |
| 5,448,011 A | 9/1995 | Laughlin |
| 5,466,164 A | 11/1995 | Miyazaki et al. |
| 5,486,121 A | 1/1996 | Miller |
| 5,488,121 A | 1/1996 | O'Lenick, Jr. |
| 5,500,487 A | 3/1996 | Leon |
| 5,516,068 A | 5/1996 | Rice |
| 5,526,952 A * | 6/1996 | Green ........................ 220/241 |
| 5,551,884 A | 9/1996 | Burkhart, Sr. |
| 5,608,196 A | 3/1997 | Hall et al. |
| 5,611,701 A | 3/1997 | Hahn |
| 5,613,874 A | 3/1997 | Orlando et al. |
| 5,625,531 A | 4/1997 | Padilla et al. |
| 5,639,991 A | 6/1997 | Schuette |
| D380,452 S | 7/1997 | Mix et al. |
| D384,643 S | 10/1997 | Nierlich et al. |
| 5,730,617 A | 3/1998 | Araki et al. |
| 5,741,153 A | 4/1998 | Schwer |
| 5,773,757 A | 6/1998 | Kenney et al. |
| 5,775,935 A | 7/1998 | Barna |
| 5,785,551 A | 7/1998 | Libby |
| 5,786,551 A | 7/1998 | Thangavelu |
| 5,807,139 A | 9/1998 | Volansky et al. |
| D399,495 S | 10/1998 | Bachschmid |
| 5,885,088 A | 3/1999 | Brennan et al. |
| 5,906,497 A | 5/1999 | Pham et al. |
| 5,925,850 A | 7/1999 | Park |
| 5,931,325 A | 8/1999 | Filipov |
| D415,472 S | 10/1999 | Kelso et al. |
| 5,967,354 A | 10/1999 | Whitehead et al. |
| 5,980,279 A | 11/1999 | Muller |
| 5,998,747 A | 12/1999 | Kelso et al. |
| 6,029,581 A | 2/2000 | Daoud |
| 6,036,516 A | 3/2000 | Byrne |
| D430,114 S | 8/2000 | Bachschmid et al. |
| 6,098,939 A | 8/2000 | He |
| 6,201,187 B1 | 3/2001 | Burbine |
| 6,209,836 B1 | 4/2001 | Swanson |
| 6,231,358 B1 | 5/2001 | Kerr, Jr. et al. |
| 6,259,351 B1 | 7/2001 | Radosavljevic et al. |
| 6,309,248 B1 | 10/2001 | King |
| 6,311,229 B1 | 10/2001 | Burchard et al. |
| 6,341,981 B1 | 1/2002 | Gorman |
| 6,371,790 B1 | 4/2002 | Huang |
| 6,392,140 B1 | 5/2002 | Yee et al. |
| D461,775 S | 8/2002 | Littrell et al. |
| 6,441,304 B1 | 8/2002 | Currier et al. |
| 6,461,189 B1 | 10/2002 | Koh |
| 6,465,735 B2 | 10/2002 | May |
| 6,484,979 B1 | 11/2002 | Medlin, Jr. |
| 6,485,336 B1 | 11/2002 | Zebermann et al. |
| 6,492,591 B1 | 12/2002 | Metcalf |
| 6,530,806 B2 | 3/2003 | Nelson |
| D472,883 S | 4/2003 | Harvey |
| 6,590,155 B2 | 7/2003 | Vrame et al. |
| 6,617,511 B2 | 9/2003 | Schultz |
| 6,623,296 B2 | 9/2003 | Okamoto |
| 6,642,450 B1 | 11/2003 | Hsiao |
| 6,648,678 B1 | 11/2003 | Kanekko |
| 6,653,566 B2 | 11/2003 | Petak et al. |
| 6,686,540 B2 | 2/2004 | Compagnone, Jr. |
| 6,700,062 B1 | 3/2004 | Allen, Jr. |
| 6,718,674 B2 | 4/2004 | Caveney et al. |

| Patent No. | Date | Name |
|---|---|---|
| 6,730,845 B1 | 5/2004 | Criniti et al. |
| 6,747,206 B1 | 6/2004 | Law |
| 6,765,146 B1 | 7/2004 | Gerardo |
| 6,767,245 B2 | 7/2004 | King |
| 6,770,814 B2 | 8/2004 | Shotey et al. |
| 6,774,307 B2 | 8/2004 | Kruse et al. |
| 6,803,521 B2 | 10/2004 | Vrame |
| 6,805,567 B2 | 10/2004 | Chapman et al. |
| 6,820,760 B2 | 11/2004 | Wagner et al. |
| 6,830,477 B2 | 12/2004 | Vander Vorste et al. |
| 6,840,785 B2 | 1/2005 | Drane |
| 6,843,680 B2 | 1/2005 | Gorman |
| 6,850,159 B1 | 2/2005 | Mudge |
| 6,863,561 B2 | 3/2005 | Gorman |
| 6,867,370 B2 | 3/2005 | Compagnone, Jr. |
| 6,870,099 B1 | 3/2005 | Schultz et al. |
| 6,875,922 B1 * | 4/2005 | Petak et al. .................. 174/58 |
| 6,884,111 B2 | 4/2005 | Gorman |
| 6,906,260 B2 | 6/2005 | Grendahl |
| 6,908,334 B2 | 6/2005 | Huang |
| 6,923,663 B2 | 8/2005 | Oddsen et al. |
| 6,925,850 B2 | 8/2005 | Comer et al. |
| 6,956,169 B1 | 10/2005 | Shotey et al. |
| 6,967,284 B1 | 11/2005 | Gretz |
| 6,986,676 B1 | 1/2006 | Tronolone et al. |
| 7,052,313 B2 | 5/2006 | Gorman |
| 7,071,414 B2 | 7/2006 | Kim |
| 7,081,009 B2 | 7/2006 | Gorman |
| 7,081,010 B2 | 7/2006 | Gorman |
| 7,083,466 B1 | 8/2006 | Hwang |
| 7,273,392 B2 | 9/2007 | Fields |
| 7,312,396 B1 | 12/2007 | Gorman |
| 7,323,638 B1 | 1/2008 | Radosavljevic |
| 7,357,652 B1 | 4/2008 | Arenas et al. |
| 7,390,965 B2 * | 6/2008 | Hartwig ........................ 174/66 |
| 7,410,072 B2 * | 8/2008 | Wegner et al. ................. 174/57 |
| 7,442,874 B2 * | 10/2008 | Compagnone, Jr. ........... 174/66 |
| 7,468,486 B2 * | 12/2008 | Yan .............................. 174/58 |
| 7,495,170 B2 * | 2/2009 | Dinh et al. .................... 174/58 |
| 2002/0185296 A1 | 12/2002 | Schultz et al. |
| 2003/0178218 A1 | 9/2003 | Shotey et al. |
| 2003/0189043 A1 | 10/2003 | Wegner et al. |
| 2003/0205654 A1 | 11/2003 | Petak et al. |
| 2003/0213801 A1 * | 11/2003 | Bradley et al. |
| 2004/0048507 A1 | 3/2004 | Hage |
| 2004/0129444 A1 | 7/2004 | Adams et al. |
| 2005/0001123 A1 | 1/2005 | Cheatham et al. |
| 2005/0067180 A1 | 3/2005 | Dinh |
| 2005/0067546 A1 | 3/2005 | Dinh |
| 2005/0176278 A1 | 8/2005 | Cheatham et al. |
| 2005/0224249 A2 | 10/2005 | Wegner et al. |
| 2005/0250378 A1 | 11/2005 | Gorman |
| 2006/0021780 A1 | 2/2006 | Hill |
| 2006/0065510 A1 | 3/2006 | Kiko et al. |
| 2007/0072486 A1 | 3/2007 | Gorman |
| 2007/0072487 A1 | 3/2007 | Gorman |

* cited by examiner

ADJUSTABLE PLASTER RING COVER

CROSS-REFERENCE TO RELATED APPLICATIONS

This application is a continuation of U.S. patent application Ser. No. 11/829,796 filed on Jul. 27, 2007, and entitled "PRE-WIRED POWER DISTRIBUTION SYSTEM," which claims priority from U.S. Provisional Application No. 60/833,966 filed Jul. 29, 2006 and entitled "Pre-wired Power Distribution System," each of which is incorporated by reference herein in its entirety.

INCORPORATION BY REFERENCE

Wiring modules and corresponding functional modules are described in U.S. Pat. No. 6,884,111 entitled Safety Module Electrical Distribution System, issued Apr. 26, 2005; U.S. Pat. No. 6,341,981 entitled Safety Electrical Outlet And Switch System, issued Jan. 29, 2002; and U.S. Pat. No. 6,894,221 entitled Safety Outlet Module, issued May 17, 2005. Modular electrical devices, electrical boxes and adjustable mounts are described in U.S. patent application Ser. No. 10/924,555 entitled Universal Electrical Wiring Component, filed Aug. 24, 2004. A wiring support platform is described in U.S. patent application Ser. No. 11/108,005 entitled Hinged Wiring Assembly, filed Apr. 16, 2005. All of the above-referenced patents and patent applications are hereby incorporated herein by reference.

BACKGROUND OF THE INVENTION

A power distribution system may comprise an electrical box, a plaster ring and an electrical device, such as an outlet or switch. During a roughing phase of construction, electrical boxes with attached plaster rings are mounted to wall studs at predetermined locations. A journeyman electrician routes power cables through building framing to the appropriate box. Then power cables are fed through openings in the rear or sides of the boxes and folded back inside. During a trim phase, electrical devices are mounted to the plaster rings.

SUMMARY OF THE INVENTION

Conventional electrical distribution systems consist of either prefabricated components customized for particular electrical distribution points within a building or individual components that must be planned for, ordered, allocated to building locations and then attached together and wired during installation at each electrical distribution point. Further, it is impractical to test each wired installation for conformance to construction standards.

A pre-wired power distribution system, in contrast, advantageously combines installation flexibility, convenience and verifiability. A combination electrical box, plaster ring, one or more electrical devices installed in the plaster ring and one or more pre-wired grounds between the electrical box and the electrical device or devices provides for a pre-tested ground path. In an embodiment, the electrical device is a wiring module configured to accept any of various functional modules. The pre-wired ground also functions as a lanyard between the electrical device and the electrical box, allowing the plaster ring to be pivoted to, and supported in, an open position to provide hands-free connection of power wires to the electrical device. This feature is particularly useful for wiring gang electrical boxes housing multiple electrical devices. In an embodiment, a ground bus bar mounted to the electrical box provides further flexibility by accommodating multiple grounds for power cables routed to the electrical box. In this manner, an electrical box, a plaster ring and wiring module or other electrical device or devices may be manufactured, assembled, distributed and/or installed as a pre-wired power distribution component, by itself or in combination with an adjustable mount.

DETAILED DESCRIPTION OF THE PREFERRED EMBODIMENT

Figure 1A:
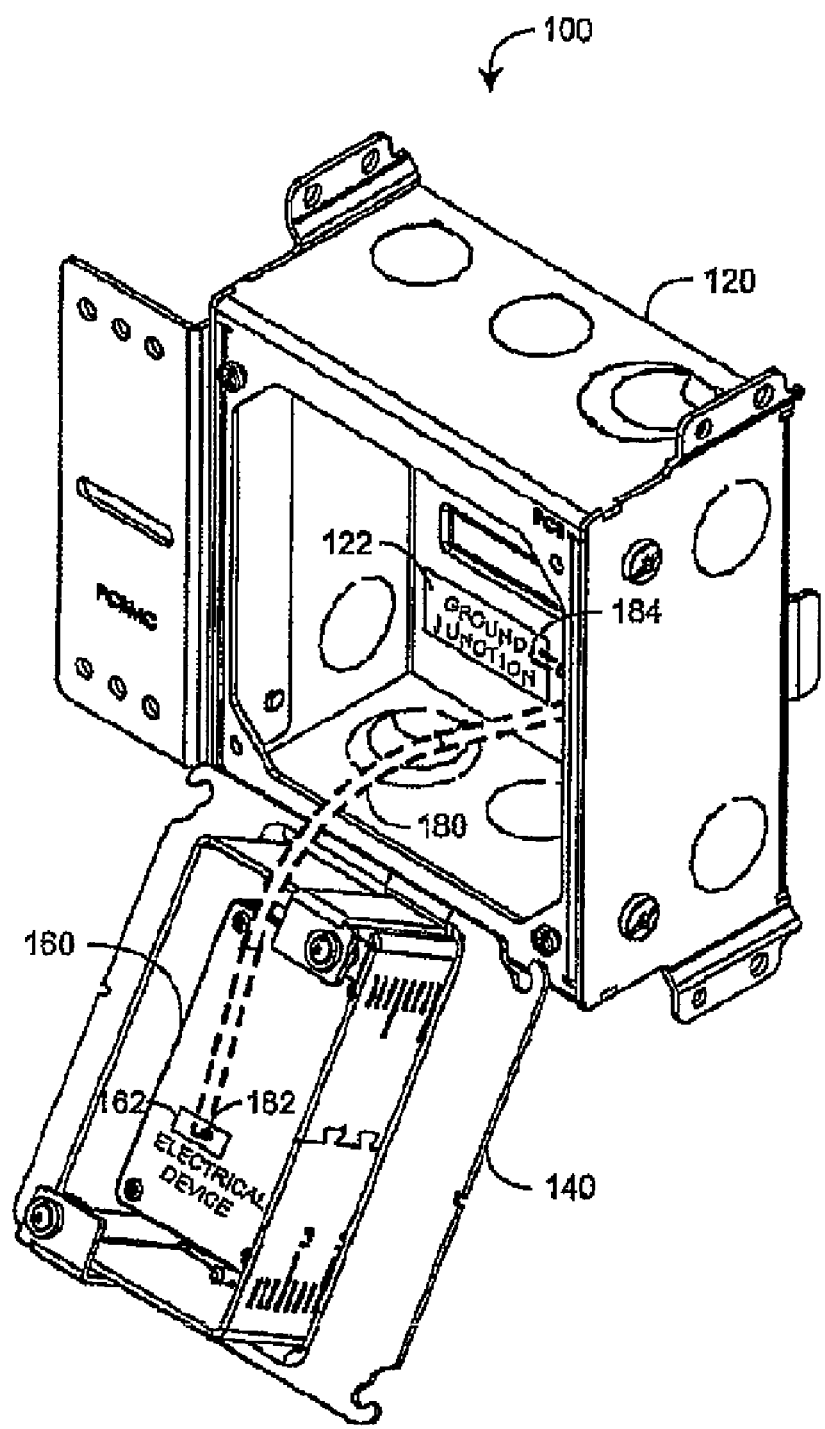
FIGS. 1A-B are perspective views of a pre-wired power distribution system in an open position and a closed position, respectively.
Figure 1B:
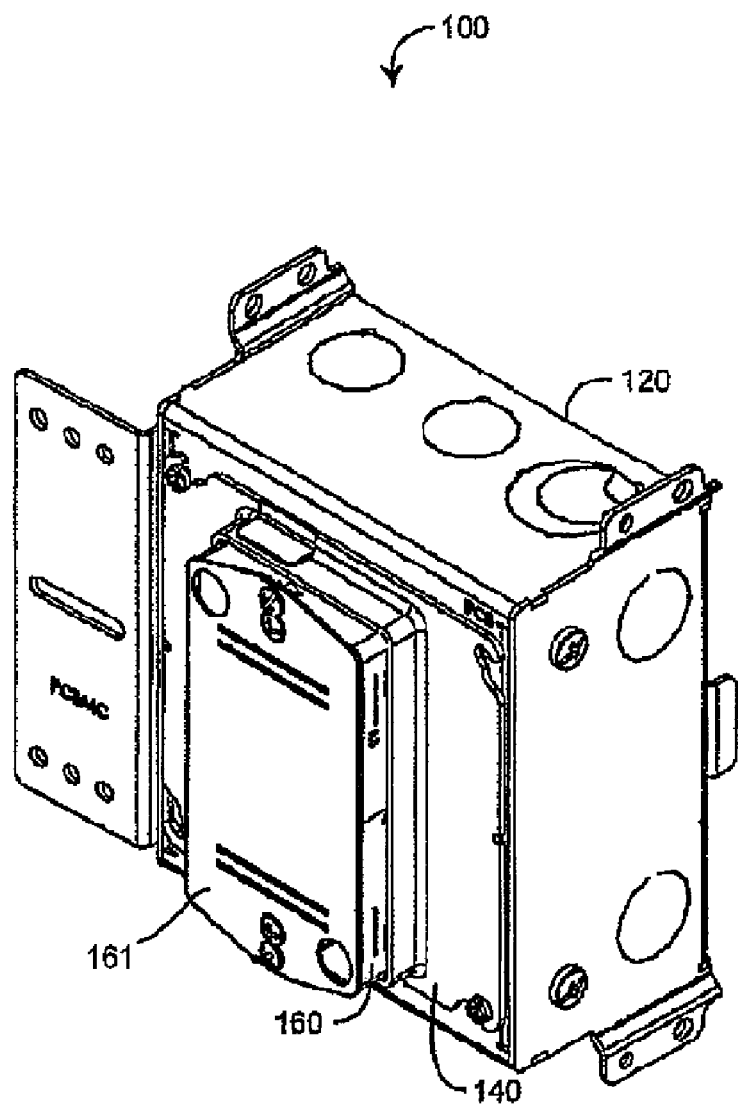

FIGS. 1A-B illustrate a pre-wired power distribution system 100 having an electrical box 120 configured to attach at least one power cable, an adjustable plaster ring 140, an electrical device 160 mounted to the plaster ring 140 and a ground lanyard 180 pre-wired between the electrical device 160 and the electrical box 120. The electrical box 160 can be any type known in the art.

In some embodiments, the electrical device 160 is a wiring module that is configured to connect to a source of electrical power via a plurality of cables (e.g., hot, neutral, and ground cables). The plurality of cables (not shown) are fed through the electrical box 120 and connected to a wiring portion of the wiring module, as disclosed herein. In some embodiments, once the wiring module is connected to power cables and fully installed within the electrical box 120, the wiring portion of the wiring module is substantially enclosed by the electrical box 120 and the adjustable plaster ring 140, and is inaccessible to users. The wiring module also includes a user-accessible portion that removably accepts a functional module (not shown) that provides a selected electrical power distribution function. For example, the functional module may be an outlet receptacle or a switch. The user-accessible portion of the wiring module includes shielded connectors, or sockets, that mate with the functional module. The shielded connectors help reduce the risk of electrical shock to users when a functional module is not installed in the wiring module. In FIG. 1B, the shielded connectors are concealed by a protective cover 161 that protects the connectors from foreign objects, for example, during a rough-in phase of construction. The functional module can be installed without accessing the wiring portion of the wiring module or the power cables.

In some embodiments, the electrical device 160 (e.g., a wiring module) is mounted to the adjustable plaster ring 140. The adjustable plaster ring provides for an adjustable distance between the electrical device 160 and the electrical box 120. For example, the adjustable plaster ring may include adjusting screws that can be turned to increase or decrease the distance between the electrical device 160 and the electrical box 120. In this way, the depth of the electrical device 160 within a wall can be adjusted to result in the desired fit with the wallboard.

One lanyard end 182 is connected to a box ground junction 122 and another lanyard end 184 is connected to an electrical device terminal 162. The plaster ring 140 can be releasably attached to the electrical box 120. The plaster ring 140 is movable between an open position FIG. 1A distal the electrical box 120 and a closed position FIG. 1B proximate the electrical box 120. The plaster ring 140 can be releasably attached to the electrical box 120 in the closed position. The ground lanyard 180 provides a ground path from the electrical device 160 to the electrical box and mechanically supports the plaster ring in the open position. In some embodiments, however, the ground lanyard 180 does not necessarily support the plaster ring in the open position.

In an embodiment, the ground lanyard 180 is a ground wire connected between a single point ground 222 (FIG. 2) on the electrical box 120 and a ground terminal 252 (FIG. 2) on the electrical device 160, as described in further detail with respect to FIGS. 2-3, below. In another embodiment, the ground lanyard 180 includes multiple ground wires connected between a ground bus bar 450 (FIG. 4) mounted on a multi-gang electrical box 420 (FIG. 4) and the ground terminals 462 (FIG. 4) of multiple electrical devices 460 (FIG. 4) mounted in a multi-gang plaster ring 440 (FIG. 4), as described in further detail with respect to FIG. 4, below. As described herein, the electrical devices 160 may be wiring modules that are configured to accept various functional modules. The electrical box 120 is adapted to utilize various adjustable or fixed stud brackets, and the plaster ring 140 may be adjustable. These aspects facilitate the positioning of the mounted electrical devices during wall installation of the ground wire supporting wiring assembly 100. With this combination of features, a pre-wired power distribution system provides a broadly adaptable electrical system component.

The connections between the ground lanyard 180 and the electrical box 120 can be formed using any type of connection known in the art. For example, a connection between the ground lanyard 180 and the electrical box 120 or the electrical device 160 may comprise an electrical screw terminal or a push-in connector. In some embodiments, the electrical screw terminal is treated with a threadlocker material once the connection is made to improve the mechanical reliability of the connection. The ground lanyard 180 can also be soldered or clamped to the electrical box 120 or the electrical device 160. Advantageously, in cases where the electrical device 160 is a wiring module, the connection between the ground lanyard 180 and the electrical box 120 or the electrical device 160 can be made substantially permanent because the wiring module need not be removed to replace an outlet receptacle, switch, or other similar functional module. In contrast, it would generally be undesirable to form a permanent ground connection between a conventional outlet receptacle or switch and an electrical box 120 because doing so may prevent the replacement of the conventional outlet receptacle or switch. The fact that the connections between the ground lanyard 180 and the electrical device 160 or the electrical box 120 can be made substantially permanent can also allow the connections to be made stronger (allowing the ground lanyard to support the weight of the electrical device 160 and adjustable plaster ring 140, as described herein) and more reliable, both from a mechanical and an electrical standpoint.

The pre-wired ground lanyard 180 can be advantageously tested at the manufacturer. In an embodiment, the ground lanyard 180 is subjected to a mechanical pull test and an electrical continuity test. In a particular embodiment, the pull-test has at least a 20 lb. force. The mechanical pull test and the electrical continuity test would otherwise be too cumbersome to perform on ground connections installed by an electrician at a worksite. However, since the ground connection between the electrical device 160 and the electrical box 120 is installed at the manufacturer, these tests can be performed more efficiently than can be done at a worksite. Moreover, these tests can be performed using equipment that is too expensive or bulky to use at a worksite where the ground connection might otherwise be installed. In some embodiments, however, the ground lanyard 180 is not pre-wired but is instead configured to be connected upon installation of the electrical device 160 within the electrical box 120.

Since the ground connection between the electrical device 160 and the electrical box 120 acts as a pull-tested lanyard 180, the plaster ring 140 can be supported in an open position (FIG. 1A) by the ground lanyard 180, advantageously allowing an electrician hands-free access to one or more electrical devices 160 so as to wire these devices to power cables routed to the electrical box 120. Upon wiring completion, the plaster ring 140 is moved to a closed position (FIG. 1B) and secured to the electrical box 120. Multiple electrical devices 160 can be pre-attached to the plaster ring 140 because doing so does not block access to the electrical box 120 or impede the wiring process. Further, the use of a ground bus bar as the electrical box ground junction 184 advantageously allows the ground wiring of one or more power cables to the bus bar without resorting to ad hoc pigtail junctions or the use of the electrical device connectors.

Figure 2:
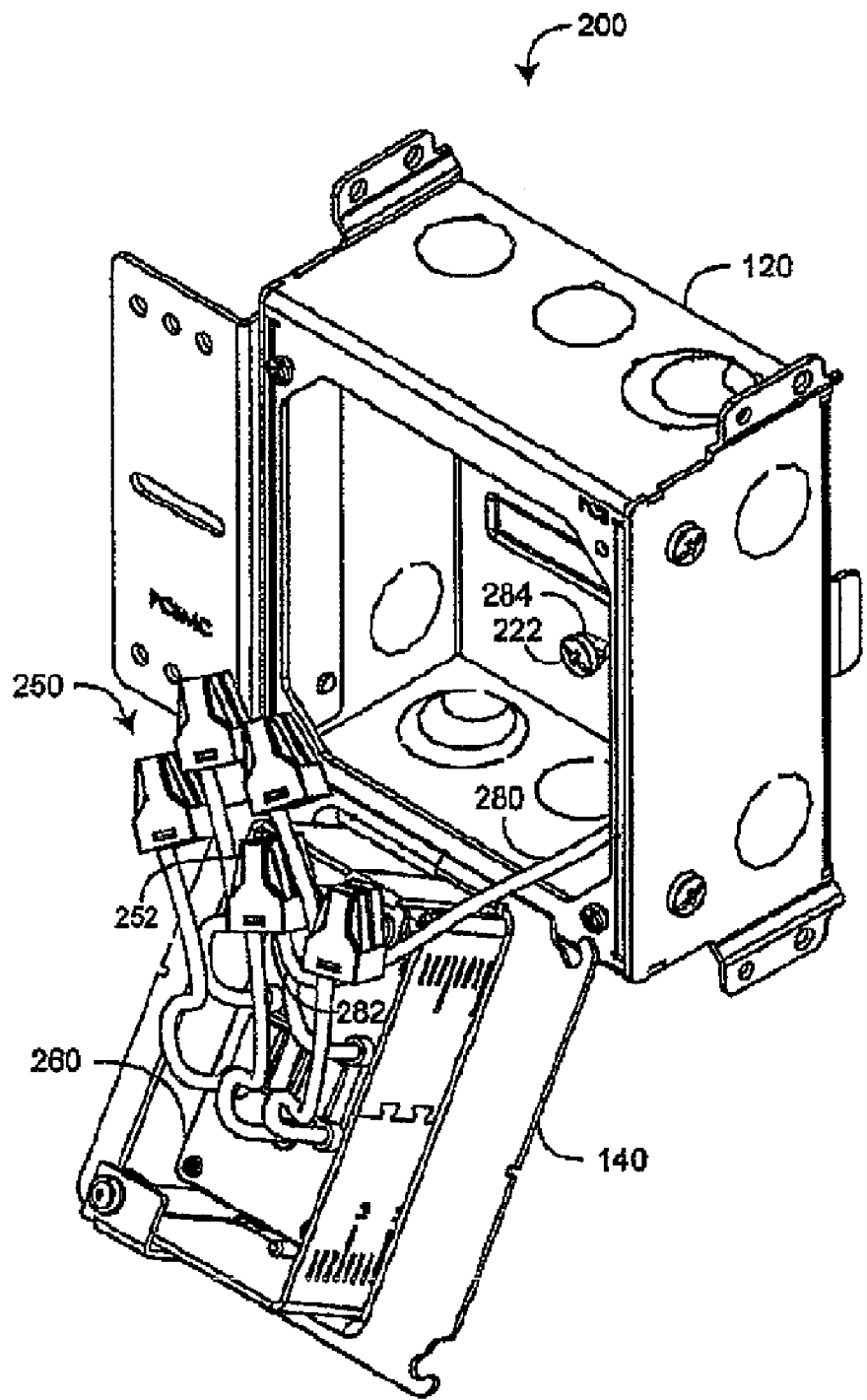
FIG. 2 is a perspective view of a pre-wired power distribution system embodiment having a writing module with external push wire connectors.

FIG. 2 illustrates a pre-wired power distribution system embodiment 200 having a wiring module 260 pre-wired with push-wire connectors 250. A ground wire 280 extends between the wiring module 260 and an electrical box 120. In some embodiments, the ground wire 280 includes a push-wire connector at some point along its length to be connected to a ground cable fed into the electrical box 120 along with other power distribution cables. The ground wire 280 has a first end 282 attached to a ground push-wire connector 252 and a second end 284 secured to a ground attachment point 222 in the interior of the electrical box 120. In some embodiments, the ground attachment point 222 is a screw terminal. The push-wire connectors 250 are connected to internal crimp wires of the wiring module 260 and adapted to accept power and ground wires from cables (not shown) routed to the electrical box 120. An electrician can easily and quickly attach the power wires to the appropriate push wire connectors 250 while the plaster ring 140 is supported by the ground wire 280.

Figure 3:
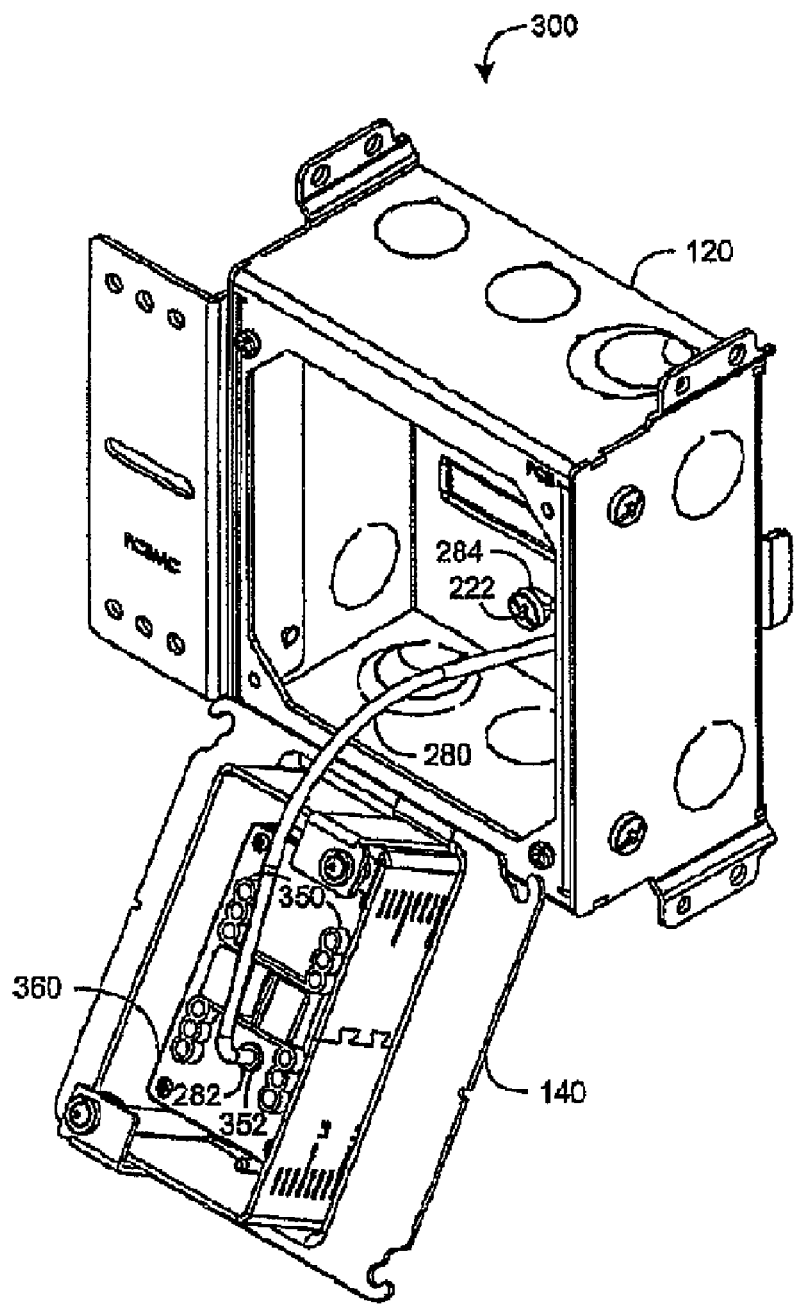
FIG. 3 is a perspective view of a pre-wired power distribution system embodiment having a wiring module with internal push wire connectors.

FIG. 3 illustrates another pre-wired power distribution system embodiment 300 having a wiring module 360 with internal push-wire connectors 350. A ground wire 280 extends between the wiring module 360 and an electrical box 120. The ground wire 280 has a first end 282 attached to a ground push-wire connector 352 and a second end 284 secured to a ground attachment point 222 in the interior of the electrical box 120. The push-wire connectors 350 are adapted to accept power and ground wires from cables (not shown) routed to the electrical box 120.

Figure 4A:
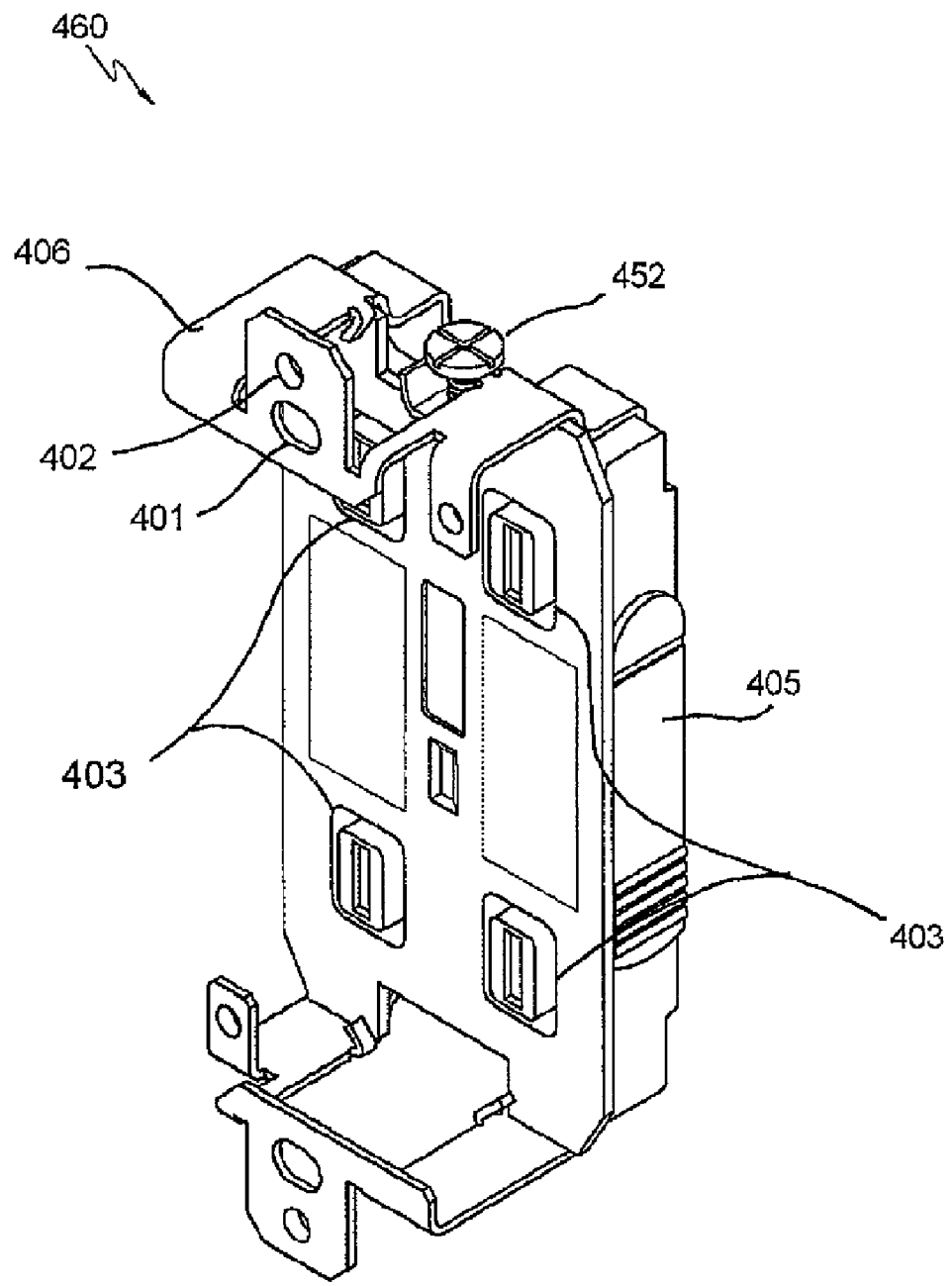
FIG. 4A is a front perspective view of an embodiment of a wiring module with internal push wire connectors.

FIG. 4A is a front perspective view of an embodiment of a wiring module 460 having internal push-wire connectors 407. The wiring module 460 has a mounting bracket 406 with an aperture 401 to mount the wiring module 460 to an adjustable plaster ring (e.g., 140) and an aperture 402 to attach a protective cover (e.g., 161) to the wiring module 460. The wiring module 460 also includes shielded connectors 403 for receiving a functional module (e.g., an outlet receptacle functional module or a switch functional module).

Figure 4B:
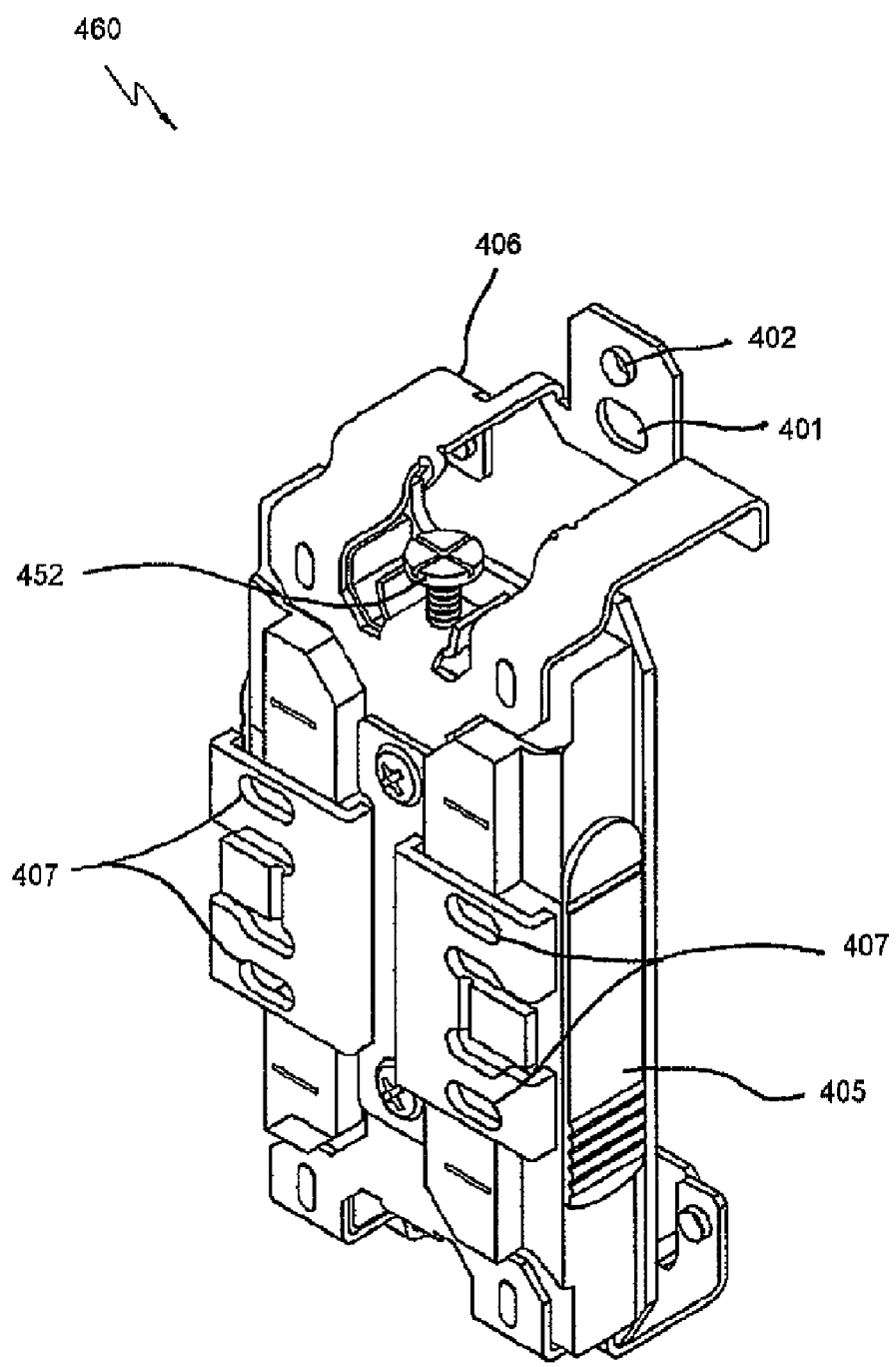
FIG. 4B is a rear perspective view of the wiring module of FIG. 4A.

FIG. 4B is a rear perspective view of the wiring module 460. The wiring module 460 includes a screw terminal ground lanyard connection point 452. In other embodiments, the ground lanyard connection point is, for example, an internal push-wire connector, a soldered joint, or a clamped joint. The wiring module 460 also includes internal push-wire connectors 407 for receiving power cables (e.g., hot, neutral, and ground power cables) routed to an electrical box (e.g., 120). The internal push-wire connectors 407 can also be used for creating a ground connection between the wiring module 460 and an electrical box (e.g., 120). For example, the wiring module 460 could be mechanically and electrically coupled to an electrical box via a pre-wired ground lanyard (e.g., 180). The internal push-wire connectors 407 can be, for example, any type of push-in connector housed wholly or partially within the wiring module 460 for receiving power cables. In some embodiments, the internal push-wire connectors 407 are stab-in connectors. The wiring module 460 also includes a tab 405 that covers screw terminals that are in electrical contact with individual ones of the internal push-wire connectors 407. The screw terminals can be used as an alternative to the internal push-wire connectors 407 if desired.

The internal push-wire connectors 407 are particularly advantageous in situations where space within the electrical box 160 is limited or in any other setting where it is desirable to conserve space within the electrical box 160. This may be true, for example, in relatively shallow walls (e.g., walls measuring less than about 3" from the outside edge of a wall stud to the back wall). The internal push-wire connectors 407 conserve space within the electrical box 160 (or allow for the usage of a shallower depth electrical box 160) because they do not include a length of wire between the wiring module and a connector as is the case for the embodiment illustrated in FIG. 2 having external push-wire connectors 250. While such external push-wire connectors 250 are desirable under some circumstances, the internal push-wire connectors of FIGS. 3-4 can result in space and cost savings due to the elimination of wire joining the connectors (e.g., 250) to the wiring module (e.g., 260). It should be understood that the wiring module 460 with internal push-wire connectors can be used with or without a pre-wired ground lanyard (e.g., 180).

Figure 5:
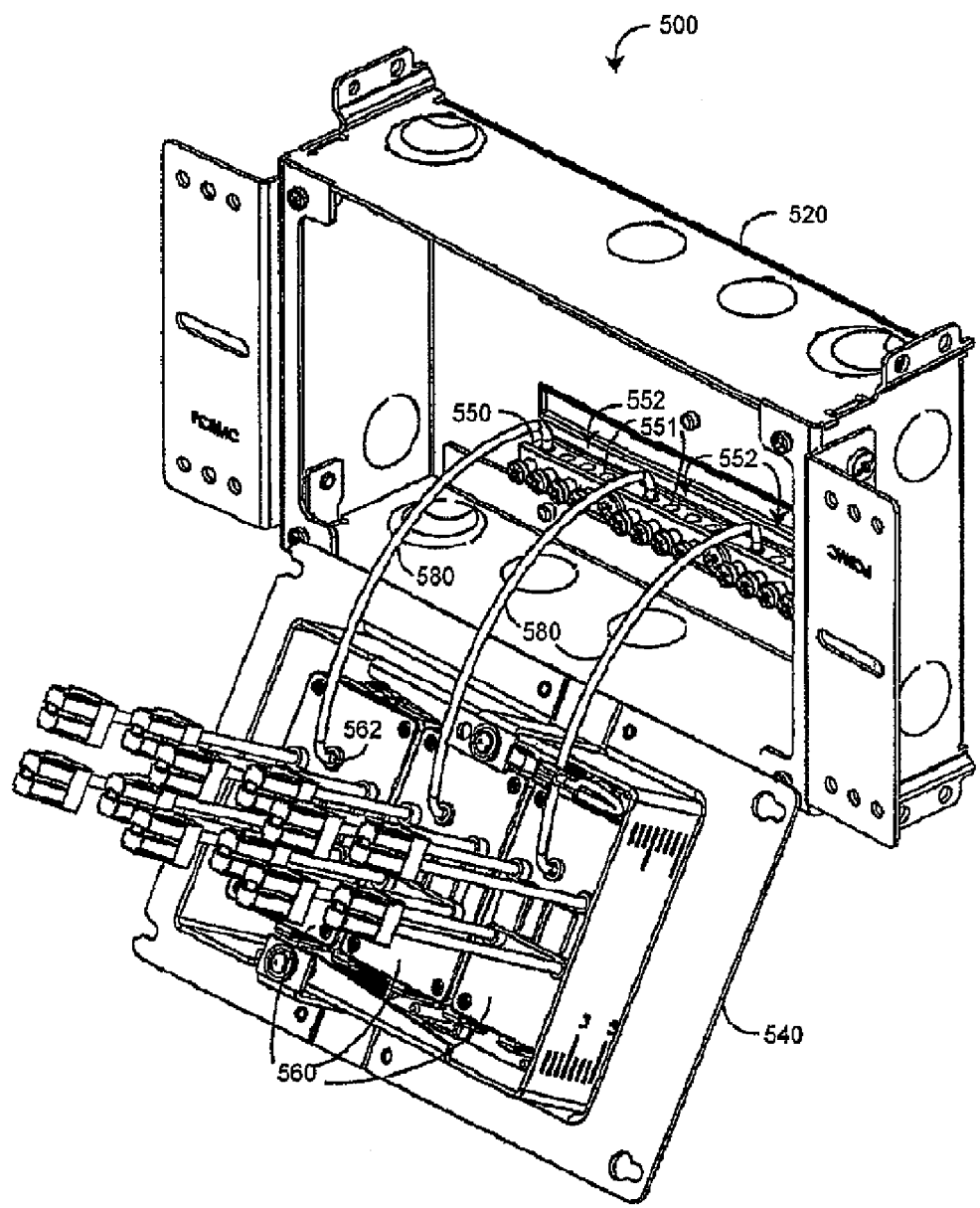
FIG. 5 is a perspective view of a pre-wired power distribution system embodiment having a box-mounted ground bus bar.

FIG. 5 illustrates a pre-wired power distribution system embodiment 500 having a 3-gang electrical box 520, a 3-gang adjustable plaster ring 540, a ground bus bar 550 mounted directly to the electrical box 520, three wiring modules 560 attached to the plaster ring 540 and a multiple wire ground lanyard 580. The ground lanyard 580 extends between the bus bar 550 and ground terminals 562 on each of the wiring modules 560. The bus bar 550 is configured to accept additional ground wires from power cables routed to and from the electrical box 520. As such, the ground lanyard 580 supports the plaster ring 540 in the open position shown, providing a wiring platform for the electrician to wire all three wiring modules 560 as a unit without having to handle and hold each of the wiring modules individually during the wiring process.

Advantageously, the bus bar 550 is configured to allow the attachment of multiple ground wires 580 so as to provide ground connections for not only wiring modules, but also power cables routed in and out of the electrical box 520. The bus bar 550 has a plurality of sections 552 and individual terminals 551 within each section. In an embodiment, there is one section 552 corresponding to each of the wiring modules 560 and multiple terminals 551 in each section. Each of the sections can be in electrical contact or electrically isolated. In this manner, ground wiring capacity increases with the size and electrical device mounting capacity of the electrical box 520. Each terminal 551 is configured to accept a ground wire 580 from either a wiring module 560 or an attached power cable. In a 3-gang embodiment, the bus bar 550 has three sections corresponding to three wiring modules, and each section has four terminals configured to accept up to four ground wires, though other numbers of sections and terminals are also possible. The bus bar 550 advantageously eliminates the need for pigtail ground connections or the equivalent use of electrical device terminals. The bus bar 550 can be configured for use with external push wire connector wiring modules 260 (FIG. 2), internal push wire connector wiring modules 360 (FIG. 3) or any electrical devices having push-wire, screw terminal or similar wire connectors.

Although described and illustrated herein with respect to 1- and 3-gang embodiments, a pre-wired power distribution system can be configured for any number of electrical devices, including 2-gang, 4-gang, and other many-gang embodiments. A pre-wired power distribution system has been disclosed in detail in connection with various embodiments. These embodiments are disclosed by way of examples only and are not to limit the scope of the claims that follow. One of ordinary skill in art will appreciate many variations and modifications.

Figure 6:
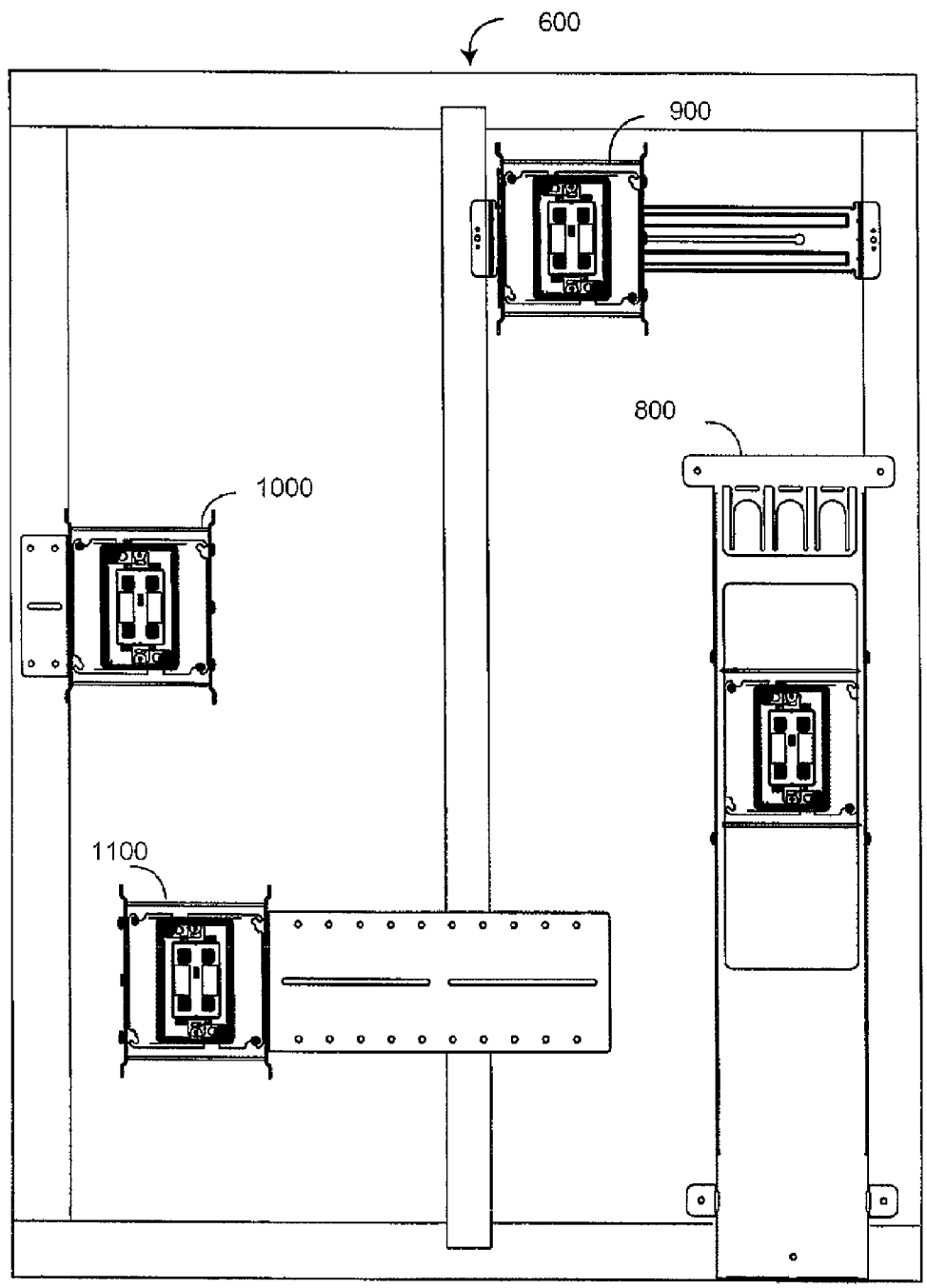
FIG. 6 is a front view of a modular integrated wiring system utilizing various embodiments of a universal electrical wiring component.

FIG. 6 illustrates a modular integrated wiring system 600 utilizing universal electrical wiring component embodiments 800-1100. A floor bracket component 800, a stud bracket component 900, a box bracket component 1000 and an extended box bracket 1100 are included, providing adaptability for different electrical power distribution designs. Each wiring component 800-1100 provides mounting flexibility by adjusting to various wall dimensions, stud configurations, and electrical distribution point locations. Specifically, each component 800-1100 has an adjustable depth into the wall, guaranteeing a flush finish with the wall surface at every electrical distribution point. In addition, the floor bracket component 800 provides an adjustable height. The stud bracket component 900 can be positioned at any height and provides an adjustable distance between studs. The box bracket component 1000 can be positioned at any height, and the extended box bracket component 1100 can be positioned at any height and at various locations between studs. Further, each wiring component 800-1100 accommodates a variety of functional modules, including various outlets, switches, GFCI devices, and motion detectors to name few. Advantageously, the color of the functional modules and even some functionality can be readily changed at anytime without rewiring, as described below. The resulting modular integrated wiring system 600 has the labor saving advantages of prefabrication with the design and installation flexibility of individually configured and wired components.

A universal electrical wiring component combining modular electrical devices and an adjustable, modular mount is described with respect to FIG. 7, below. A floor bracket component 800 is described in further detail with respect to FIG. 8, below. A stud bracket component 900 is described in further detail with respect to FIG. 9, below. A box bracket component 900 is described in further detail with respect to FIG. 9, below, and an extended box bracket component 1100 is described in further detail with respect to FIG. 11, below. Adjustable mounts are described in detail with respect to FIGS. 12-16, below.

Figure 7:
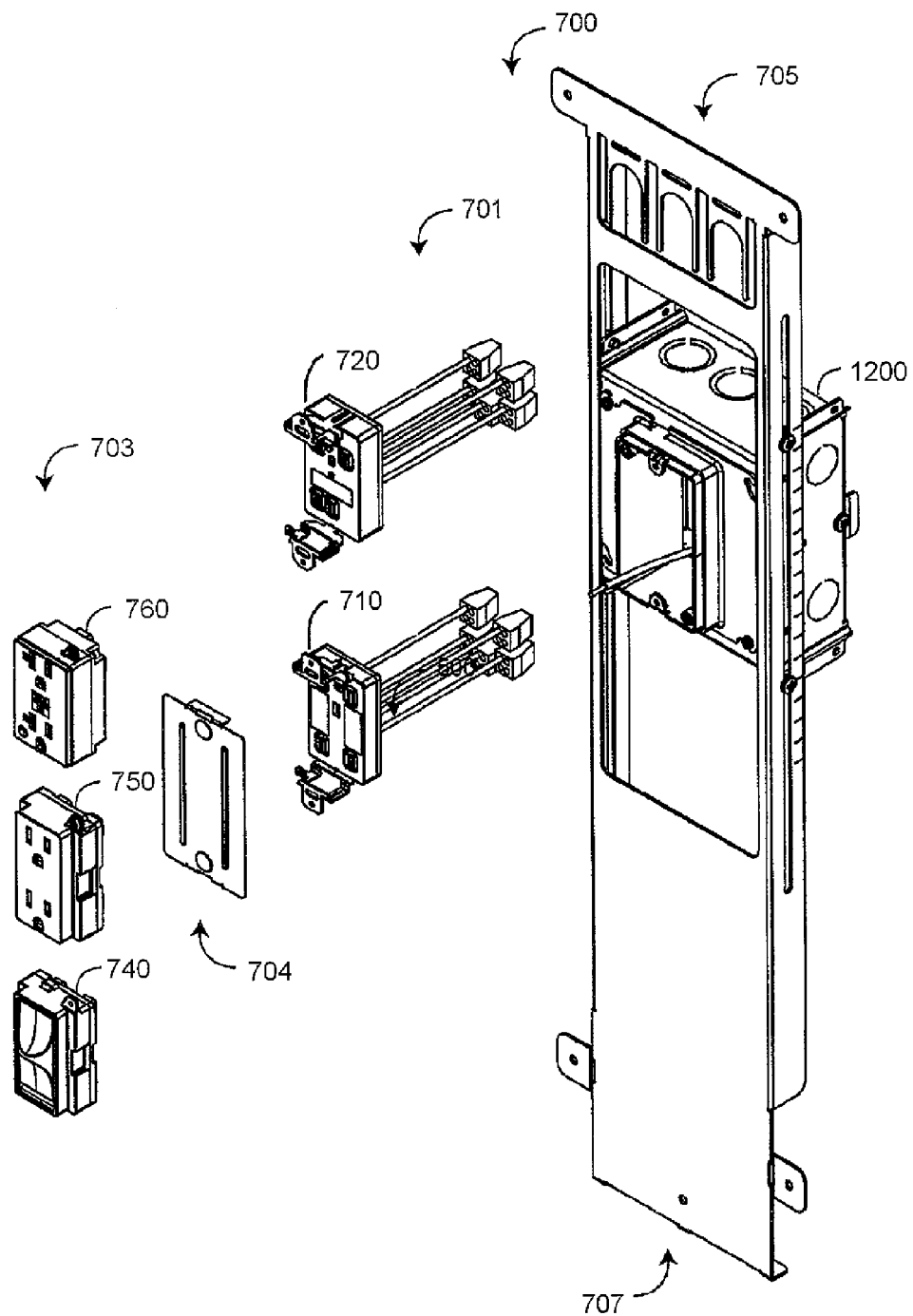
FIG. 7 is a front perspective exploded view of a universal electrical wiring component having modular electrical devices combined with an adjustable, modular mount.

FIG. 7 further illustrates a universal electrical wiring component 700 having an adjustable mount 705 combined with a wiring module 701. The adjustable mount 705 includes a bracket 707 and a box assembly 1200. The bracket 707 can be, for example, a vertically adjustable floor bracket 1300 (FIG. 13), a horizontally adjustable stud bracket 1400 (FIG. 14), a box bracket 1500 (FIG. 15), or an extended box bracket 1600 (FIG. 16). The box assembly 1200 is mounted to the bracket 707 and the wiring module 701 is mounted in the box assembly 1200. The wiring module 701 may be a regular wiring module 710 or a GFCI wiring module 720. The adjustable mount 705 is configured to position the wiring module 701 at any of various locations within a building wall. The wiring module 701 is configured to connect to a source of electrical power and to removably accept a functional module 703. Advantageously, the combination of adjustable mount and wiring module form a universal electrical wiring component that can implement a variety of electrical distribution points of an electrical system. For example, a universal electrical wiring component can accept various outlet modules 750-760 and can be adjusted to implement a wall outlet. As another example, a universal electrical wiring component can accept various switch modules 740 and can be adjusted to implement a switch outlet. A universal electrical wiring component 200 may be, for example, a floor bracket component 800 (FIG. 8), a stud bracket component 900 (FIG. 9), a box bracket component 1000 (FIG. 10) or an extended box bracket component 1100 (FIG. 11). A cover 704 may be used to protect a wiring module 701 from damage prior to functional module installation.

Figure 8:
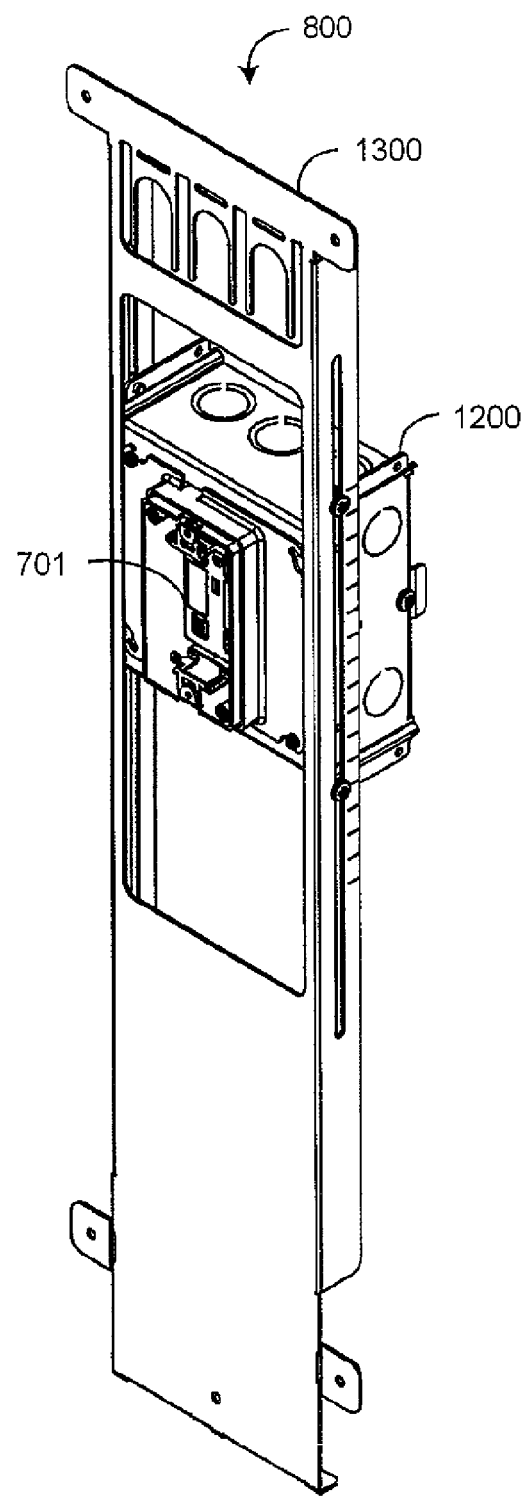
FIG. 8 is a front perspective view of a floor bracket electrical wiring component.

FIG. 8 illustrates a floor bracket component 800 having a wiring module 701 and an adjustable mount comprising a box assembly 1200 and a floor bracket 1300. In this embodiment, the floor bracket 1300 provides the wiring module 701 an adjustable height from the floor and the box assembly 1200 provides the wiring module 701 an adjustable distance from the box assembly 1200 for a flush position with a wall surface.

Figure 9:
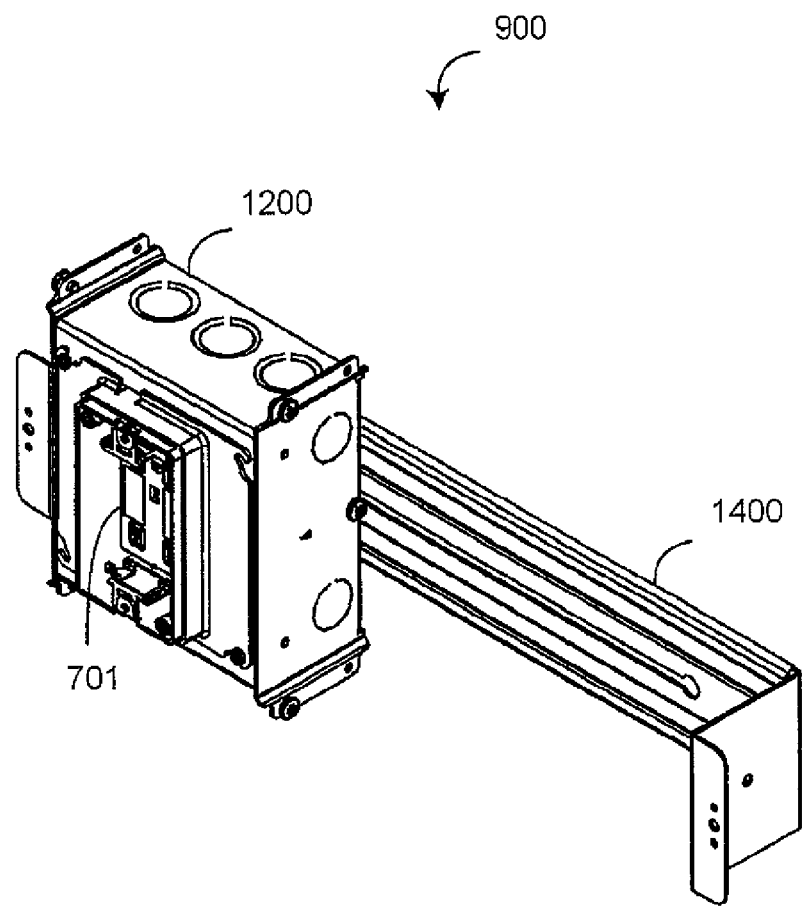
FIG. 9 is a front perspective view of a stud bracket electrical wiring component.

FIG. 9 illustrates a stud bracket component 900 having a wiring module 701 and an adjustable mount comprising a box assembly 1200 and a stud bracket 1400. In this embodiment, the stud bracket 1400 provides the wiring module 701 an adjustable distance between studs and the box assembly 1200 provides the wiring module 701 an adjustable distance from the box assembly 1200 for a flush position with a wall surface.

Figure 10:
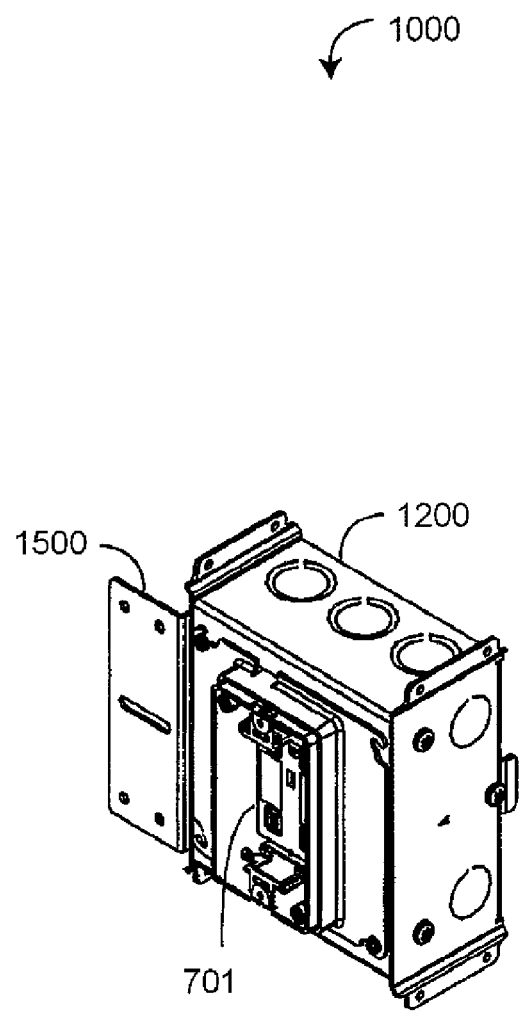
FIG. 10 is a front perspective view of a box bracket electrical wiring component.
Figure 11:
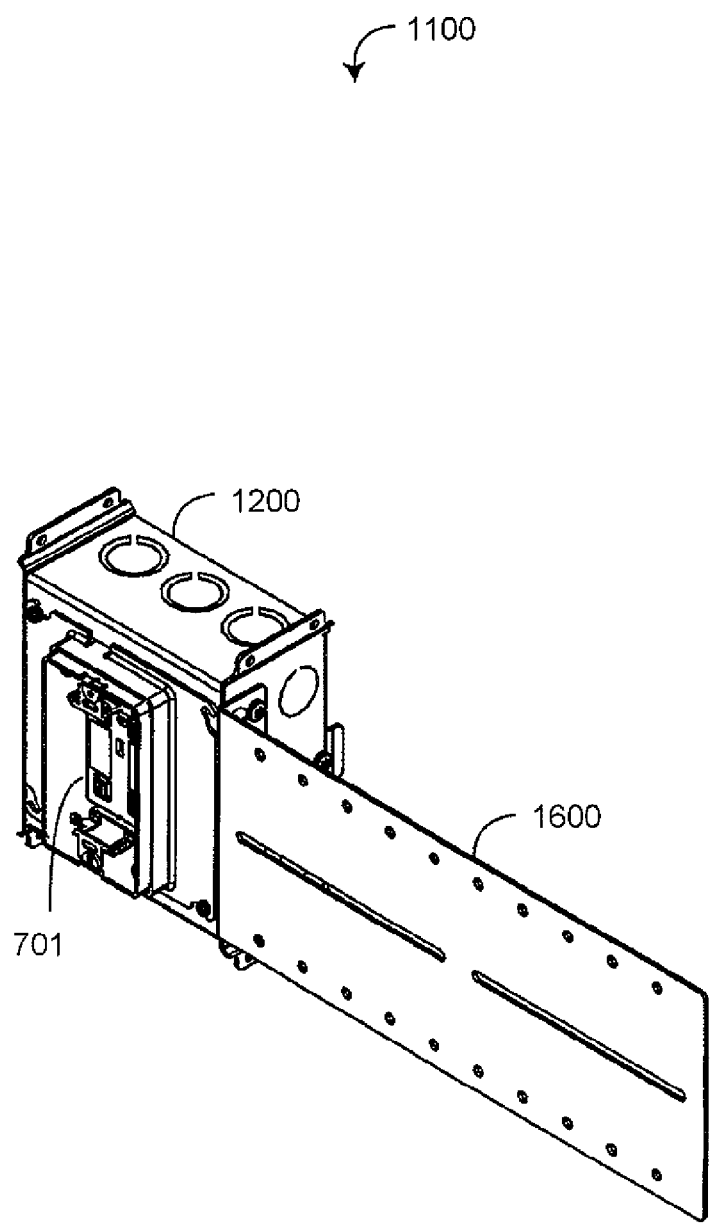
FIG. 11 is a front perspective view of an extended box bracket electrical wiring component.

FIG. 10 illustrates a box bracket component 1000 having a wiring module 701 and an adjustable mount comprising a box assembly 1200 and a box bracket 1500. In this embodiment, the box bracket 1500 allows positioning of the wiring module 701 along a vertical stud. Also, the box assembly 1200 provides the wiring module 701 an adjustable distance from the box assembly 1200 for a flush position with a wall surface.

FIG. 11 illustrates an extended box bracket component 1100 having a wiring module 701 and an adjustable mount comprising a box assembly 1200 and an extended box bracket 1600. In this embodiment, the extended box bracket 1600 allows vertical positioning of the wiring module 701 along a stud and horizontal positioning between studs. Also, the box assembly 1200 provides the wiring module 701 an adjustable distance from the box assembly 1200 for a flush position with a wall surface.

Figure 12:
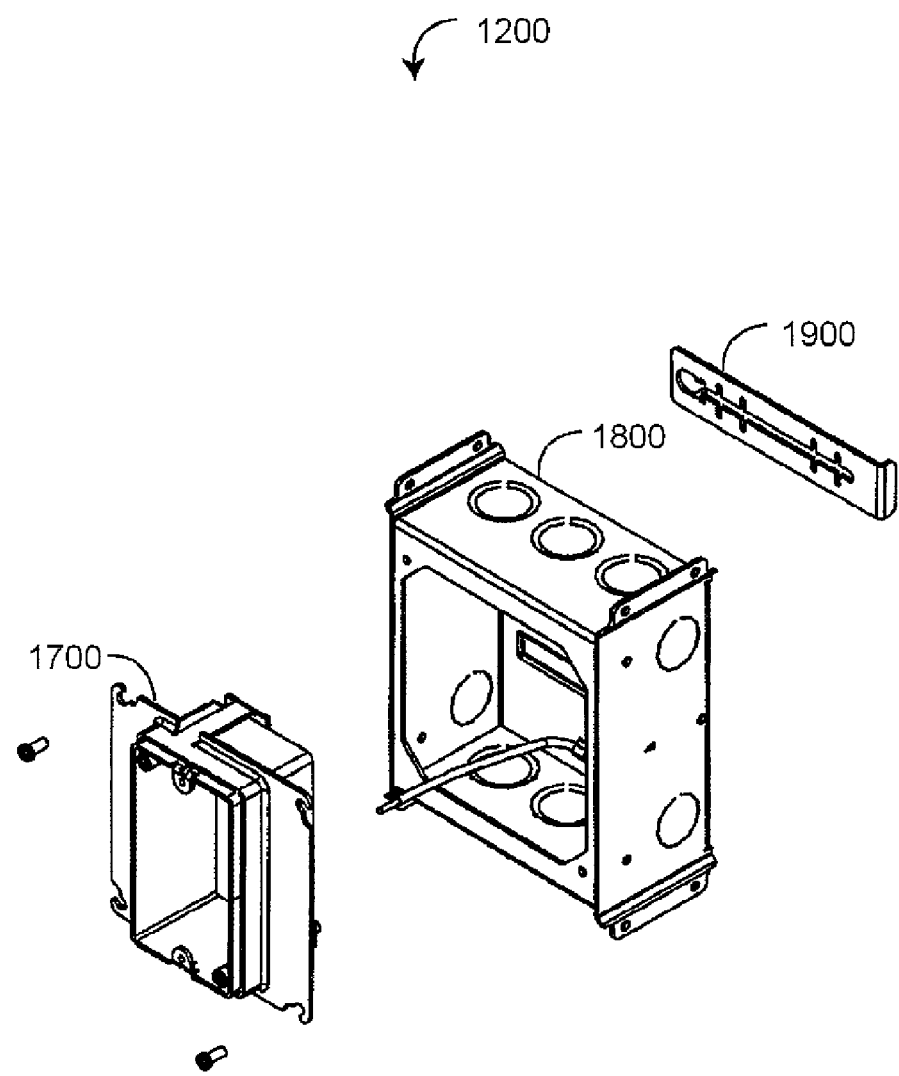
FIG. 12 is an exploded perspective view of a junction box assembly.

FIG. 12 illustrates a box assembly 1200 having a junction box 1800, an adjustable plaster ring 1700 and a support arm 1900. The plaster ring 1700 removably attaches to the junction box 1800 and a wiring module 701 (FIG. 7) attaches to the plaster ring 1700. The plaster ring provides the wiring module 701 (FIG. 7) with an adjustable distance from the junction box 1800, as described in detail with respect to FIG. 17. The junction box 1800 advantageously has an attached ground wire that can be quickly connected to a wiring module 701 (FIG. 7). The plaster ring 1700 has slotted fastener apertures so that the plaster ring 1700 along with an attached wiring module can be removed from, and reattached to, the junction box 1800 by merely loosening and tightening, respectively, the fasteners. The support arm 1900 attaches to the back of the junction box to provide support against an inside wall surface, as described in further detail with respect to FIGS. 19A-D, below.

Figure 13:
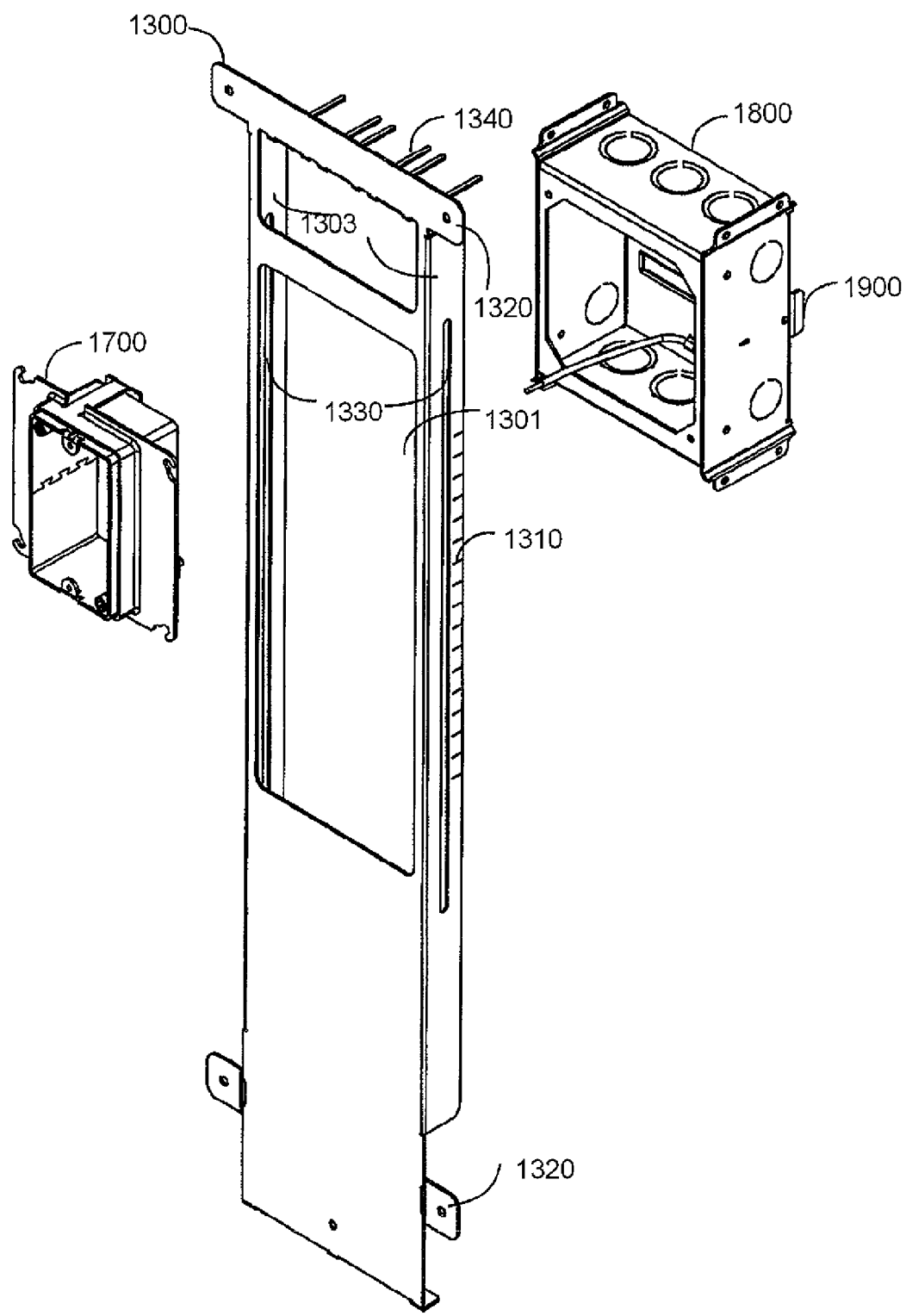
FIG. 13 is an exploded perspective view of a floor bracket assembly.

FIG. 13 illustrates a floor bracket 1300 having an open front 1301 and ruled sides 1310. The floor bracket 1300 has tabs 1320 for attaching the bracket 1300 to one or both of a floor joist or a wall stud. Side grooves 1330 allow fasteners to attach the junction box 1800 at an adjustable height from the floor. Conduit supports 1340 are adapted for attachment to conduits running to the junction box 1800. The plaster ring 1700 is attached to the box 1800 through the open front 1301 so that the plaster ring 1700 can be removed from the box 1800 without removing the box 1800 from the bracket 1300.

Figure 14:
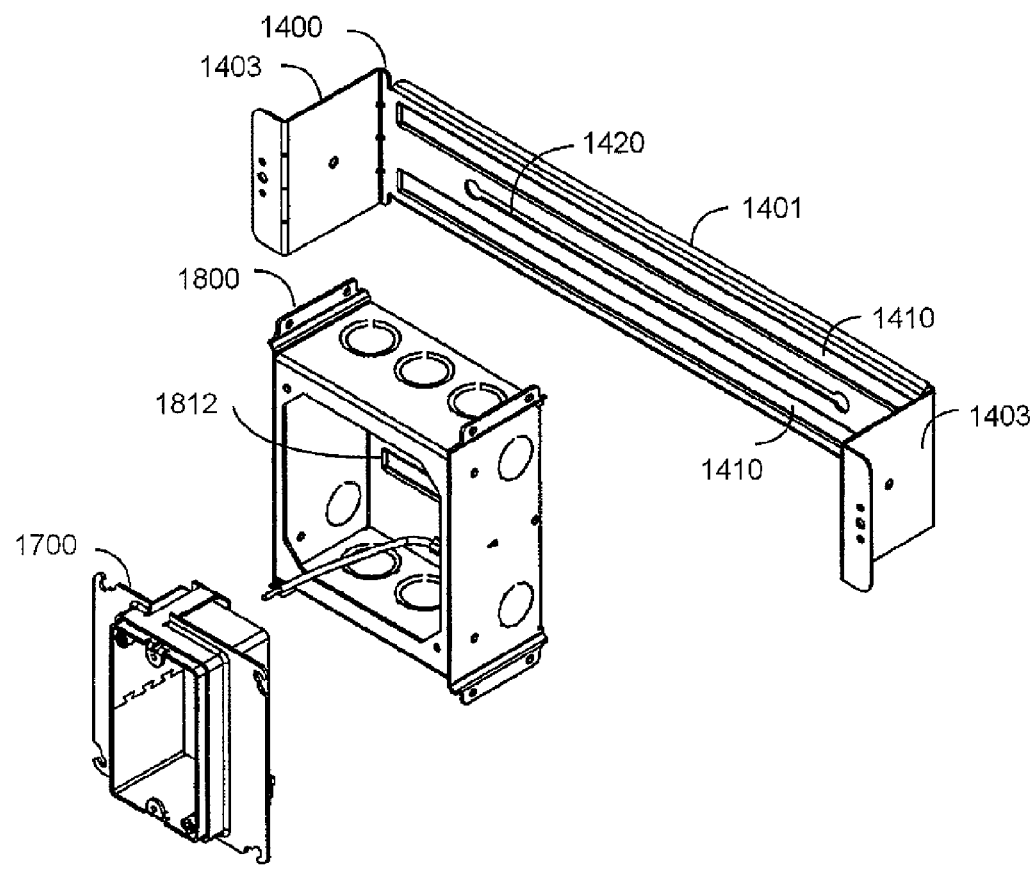
FIG. 14 is an exploded perspective view of a stud bracket assembly.
Figure 18:
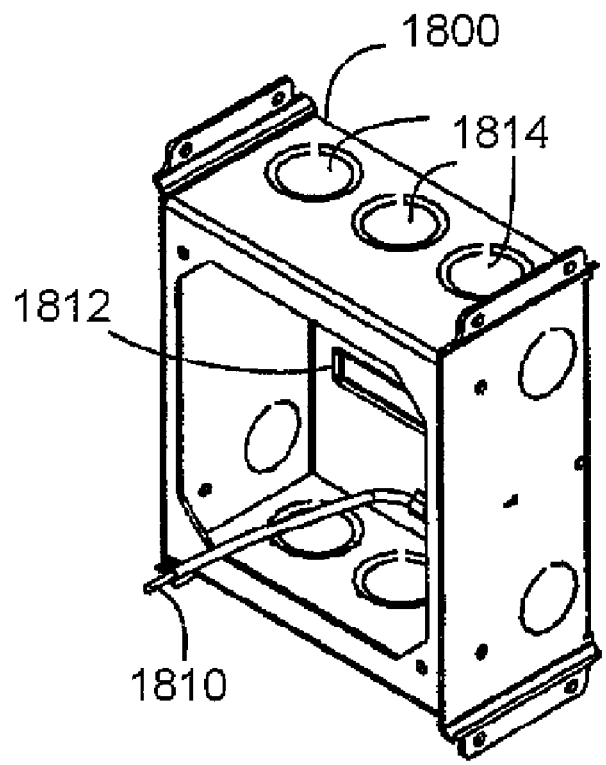
FIG. 18 is a perspective view of a junction box.
Figure 19A:
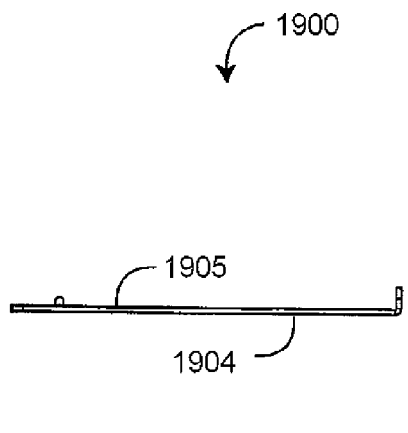
FIGS. 19A-D are top, perspective, front and side views, respectively, of a support arm.
Figure 19B:
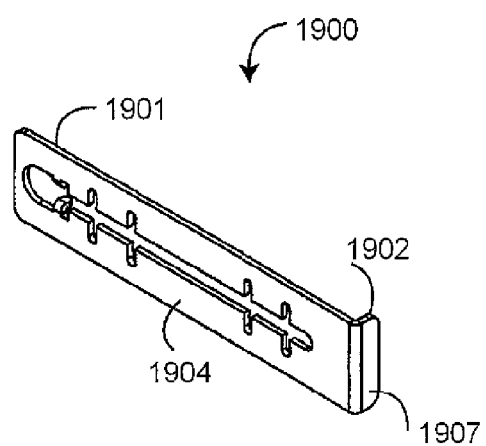
Figure 19C:
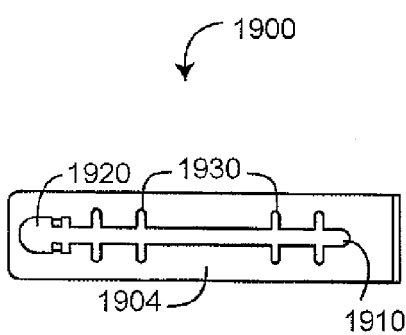
Figure 19D:
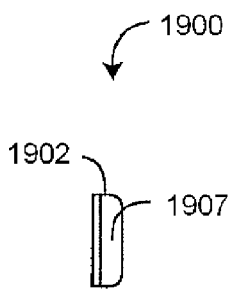

FIG. 14 illustrates a stud bracket 1400 having a horizontal bar 1401 and ends 1403. The ends 1403 are folded perpendicularly to the bar 1401 and adapted to secure the bracket 1400 horizontally between wall studs. The bar 1401 has grooves 1410 and a slot 1420 that extend horizontally to proximate both ends 1403 of the bracket 1400. The grooves 1410 are adapted to slideably retain corresponding box tongues 1812 (FIG. 18). The slot 1420 is centered between the grooves 1410 and accommodates a fastener that secures the junction box 1800 to the bracket 1400 while allowing the box to slideably adjust in position along the bar 1401. The plaster ring 1700 is attached to the box 1800 and can be removed from the box 1800 without removing the box 1800 from the bracket 1400.

Figure 15:
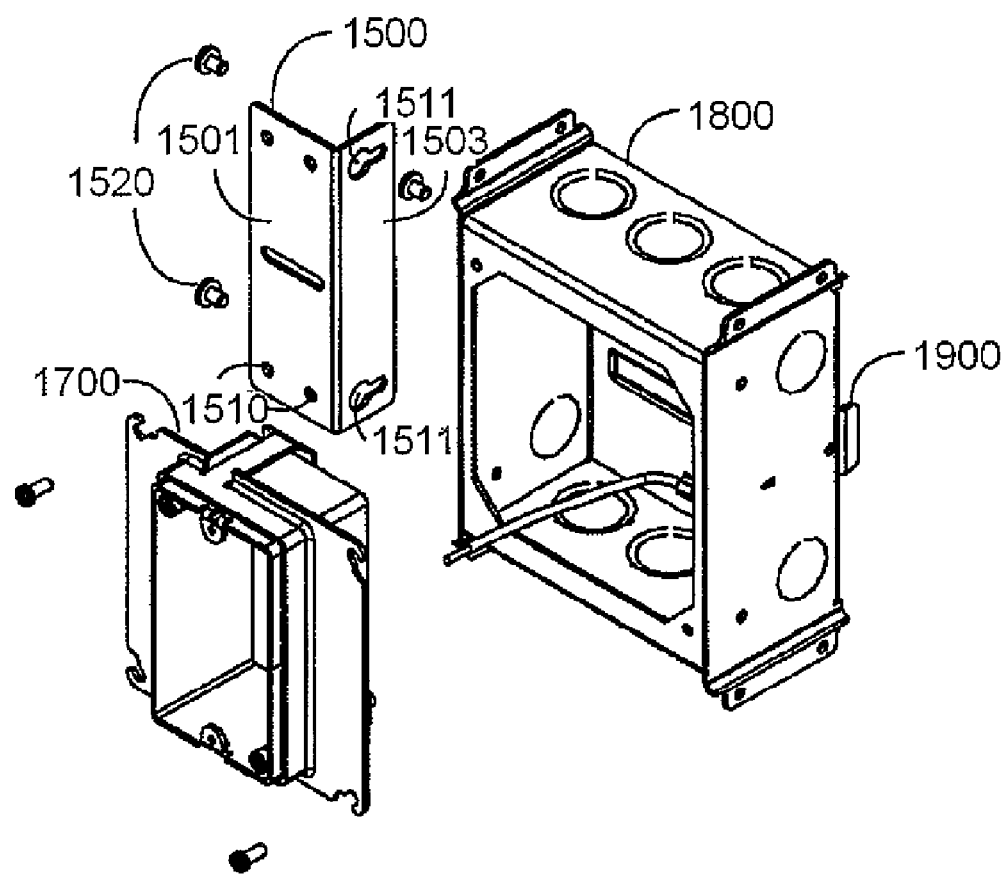
FIG. 15 is an exploded perspective view of a box bracket assembly.
Figure 16:
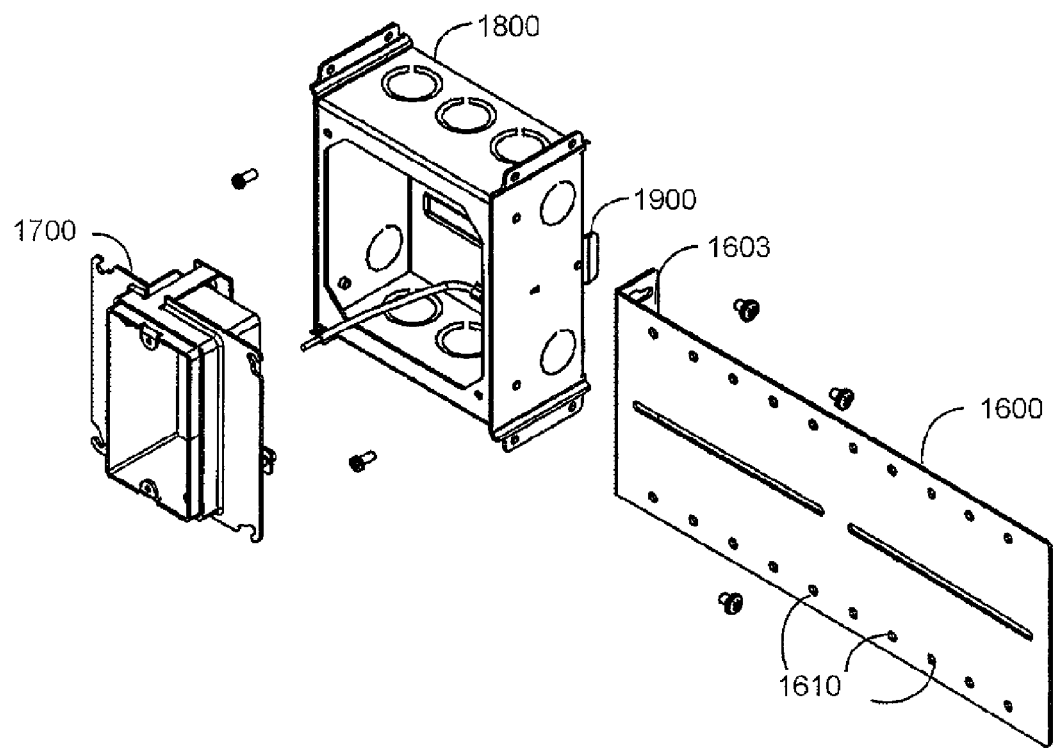
FIG. 16 is an exploded perspective view of an extended BOX bracket assembly.

FIG. 15 illustrates a box bracket 1500 having a stud mounting face 1501 and a box mounting face 1503. The stud mounting face 1501 is disposed perpendicular to the box mounting face 1503 and is adapted to fasten to a wall stud. Either side of the junction box 1800 attaches to the box mounting face 1503. The box mounting face 1503 has a keyhole slots 1511 allowing the junction box 1800 to fasten and unfasten to the bracket 1500 without removing the fasteners 1520. The stud mounting face 1501 has a plurality of mounting holes 1610 to accommodate fasteners that allow the junction box 1800 to be positioned along a stud.

FIG. 16 illustrates an extended box bracket 1600 having an extended stud mounting face 1601 and a box mounting face 1603. The box mounting face 1603 is disposed perpendicular to the extended stud mounting face 1601 and is adapted to fasten to the junction box 1800. The extended stud mounting face 1601 is adapted to fasten to a wall stud. The extended stud mounting face 1601 has a plurality of mounting holes 1610 spaced along the length of the bracket 1600 to accommodate fasteners that allows the junction box 1800 to be position vertically along a stud and horizontally between studs.

Figure 17:
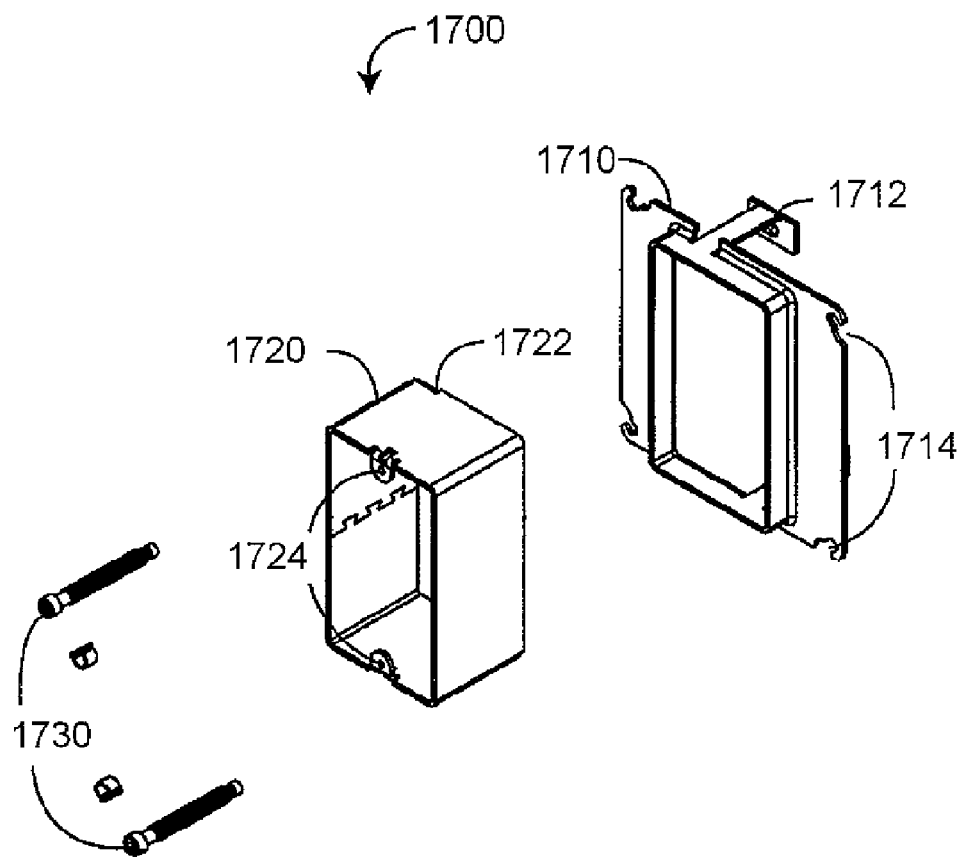
FIG. 17 is an exploded perspective view of an adjustable plaster ring.

FIG. 17 further illustrates an adjustable plaster ring 1700 having a base ring 1710, an insert ring 1720 and adjusting screws 1730. The insert ring 1720 is slideably retained by the base ring 1710 and secured to the base ring 1710 by the adjusting screws 1730. The insert ring 1720 is adapted to mount a wiring module and to adjust the wiring module position relative to the base ring 1710 in response to turning of the screws 1730. The base ring 1710 has keyhole slots 1714 adapted to accommodate fasteners that attach the plaster ring 1700 to a junction box. The keyhole slot 1714 allows the plaster ring 1700 to fasten and unfasten to the Junction box without removing the fasteners.

FIG. 18 further illustrates a junction box 1800 having a ground wire 1810, a tongue 1812 and knockouts 1814. The ground wire 1810, being pre-wired to the box, advantageously saves a fabrication step on the job site. Further, the ground wire 1810 is configured to insert into a push-wire connector on a pre-wired wiring module, providing a plug-in function module with a path to ground. The tongue 1812 stabilizes the box within a groove on a stud bracket, if used. The knockouts 1814 provide attachment points for power cable conduits.

FIGS. 19A-D further illustrate a support arm 1900 adapted to attach to a back face of the junction box 1800 (FIG. 18) and provide support against an inside wall surface. In particular, the support arm 1900 has an attachment section 1901 and a support section 1902 extending generally perpendicularly from one end of the attachment section 1901. The attachment section is generally planar having an inside face 1904 that is disposed against the junction box 1800 and an opposite outside face 1905 that is disposed distal the junction box 1800. The support section 1902 has a support face 1907 that is disposed against an inside wall surface. The attachment section 1901 has an adjustment slot 1910, a fastener hole 1920, and a plurality of bending slots 1930 distributed along and extending perpendicularly across the adjustment slot 1910. The attachment section 1901 is configured to bend along one of the bending slots 1930 so as to provide a variable length support extending generally normal to the junction box back face. The support arm 1900 is held to the box 1800 with a fastener that is slideable along the adjustment slot 1910, providing an adjustable support arm position.

A universal electrical wiring component has been disclosed in detail in connection with various embodiments. These embodiments are disclosed by way of examples only and are not to limit the scope of the claims that follow. One of ordinary skill in the art will appreciate many variations and modifications.

What is claimed is:

1. An apparatus for use in an electrical distribution system, the apparatus comprising:

an adjustable ring configured to be mounted to an electrical box, wherein the adjustable ring comprises an open front face that provides access to the interior of the electrical box;

an electrical wiring module within the interior of the electrical box, the electrical wiring module comprising one or more conductors that couple the electrical wiring module to one or more power cables, the electrical wiring module further comprising one or more connectors disposed thereon that are configured to electrically couple to a functional module;

an adjustment device configured to vary the depth of at least a portion of the adjustable ring with respect to the electrical box, such that the functional module will be in alignment with the wall surface when the functional module is installed in the electric box and is connected to the electrical wiring module; and a protective cover configured to substantially cover the open front face of the adjustable ring, wherein the protective cover comprises at least two apertures aligned with the adjustment device, the apertures being configured to permit access to the adjustment device without removal of the protective cover.

2. The apparatus of claim 1, wherein the adjustment device comprises a screw.

3. The apparatus of claim 1, wherein the adjustable ring comprises a mounting portion for mechanically coupling to an electrical device to be mounted within the electrical box.

4. The apparatus of claim 3, wherein the adjustable ring is configured to provide an adjustable distance between the electrical device and the electrical box.

5. The apparatus of claim 1, wherein the protective cover comprises a plate.

6. The apparatus of claim 5, wherein the protective cover is generally rectangular.

7. The apparatus of claim 6, wherein the two apertures are located at opposite corners of the generally rectangular protective cover.

8. An electrical wiring method comprising:

placing an electrical wiring module within the interior of the electrical box, the electrical wiring module comprising one or more conductors that couple the electrical wiring module to one or more power cables, the electrical wiring module further comprising one or more connectors disposed thereon that are configured to electrically couple to a functional module;

mounting an adjustable ring to an electrical box, wherein the adjustable ring comprises:

an open front face that provides access to the interior of the electrical box; and an adjustment device configured to vary the depth of at least a portion of the adjustable ring with respect to the electrical box, such that the functional module will be in alignment with the wall surface when the functional module is installed in the electric box and is connected to the electrical wiring module;

covering the open front face of the adjustable ring with a protective cover having at least two apertures formed therein;

accessing the adjustment device through the apertures formed in the protective cover; and adjusting the depth of at least a portion of the adjustable ring without removing the protective cover.

9. The electrical wiring method of claim 8, wherein accessing the adjustment device comprises inserting a tool through the apertures formed in the protective cover.

10. The electrical wiring method of claim 8, wherein the adjustment devices comprises a screw.

11. The electrical wiring method of claim 8, wherein the apertures formed in the protective cover are aligned with the adjustment device.

12. The electrical wiring method claim 8, further comprising coupling an electrical device to the adjustable ring.

13. The electrical wiring method of claim 8, further comprising removing the protective cover after having adjusted the depth of at least a portion of the adjustable ring.

14. An item of hardware for use with an electrical distribution system, comprising:
- a protective cover configured to substantially cover an open front face of an adjustable ring mounted to an electrical box, wherein an electrical wiring module is positioned within the interior of the electrical box, the electrical wiring module comprising one or more conductors that couple the electrical wiring module to one or more power cables, the electrical wiring module further comprising one or more connectors disposed thereon that are configured to electrically couple to a functional module, wherein the protective cover comprises at least two apertures aligned with an adjustment device for adjusting the depth of the adjustable ring relative to the electrical box, such that the functional module will be in alignment with the wall surface when the functional module is installed in the electric box and is connected to the electrical wiring module, and wherein the apertures are configured to permit access to the adjustment device without removal of the protective cover.

15. The item of hardware of claim 14, wherein the protective cover comprises a generally rectangular plate.

16. The item of hardware of claim 15, wherein the two apertures are located near opposite corners of the generally rectangular protective cover.

* * * * *